US012695323B2

(12) United States Patent
O'Neill et al.

(10) Patent No.: US 12,695,323 B2
(45) Date of Patent: Jul. 28, 2026

(54) VEHICLE BATTERY CAPACITY MEASUREMENT USING AUTONOMOUS DISCHARGE

(71) Applicant: Wing Aviation LLC, Palo Alto, CA (US)

(72) Inventors: Conor O'Neill, Mountain View, CA (US); Victor Vuong, Mountain View, CA (US); Matthew Aaron Nubbe, Santa Clara, CA (US)

(73) Assignee: Wing Aviation LLC, Palo Alto, CA (US)

( * ) Notice: Subject to any disclaimer, the term of this patent is extended or adjusted under 35 U.S.C. 154(b) by 44 days.

(21) Appl. No.: 18/643,340

(22) Filed: Apr. 23, 2024

(65) Prior Publication Data

US 2025/0330032 A1     Oct. 23, 2025

(51) Int. Cl.
H02J 7/00       (2026.01)
G01R 31/3835    (2019.01)
H02J 7/80       (2026.01)
H02J 7/82       (2026.01)

(52) U.S. Cl.
CPC .......... H02J 7/865 (2026.01); G01R 31/3835 (2019.01); H02J 7/80 (2026.01); H02J 7/82 (2026.01); Y02E 60/10 (2013.01)

(58) Field of Classification Search
CPC .... H02J 7/0068; H02J 7/0047; G01R 31/3835
See application file for complete search history.

(56) References Cited

U.S. PATENT DOCUMENTS

| | | | |
|---|---|---|---|
| 10,328,805 B1 | 6/2019 | Wyrobek | |
| 10,875,635 B2 | 12/2020 | Kita | |
| 10,899,445 B2 | 1/2021 | Augugliaro | |
| 11,675,019 B2 | 6/2023 | Alsleben | |
| 11,817,739 B1 * | 11/2023 | Lazarov | H02J 7/007194 |
| 2015/0349581 A1 | 12/2015 | Tochigi | |
| 2020/0341073 A1 | 10/2020 | Tang | |
| 2022/0385097 A1 * | 12/2022 | Lim | H02J 7/02 |
| 2023/0361590 A1 * | 11/2023 | Lacaux | H02J 7/007182 |

OTHER PUBLICATIONS

"How to deep discharge batteries" PhantomPilots, https://phantompilots.com/threads/how-to-deep-discharge-batteries.133832/, retrieved Apr. 23, 2024.
International Bureau, International Search Report and Written Opinion in PCT/US2025/025732, mailed May 7, 2026.

* cited by examiner

*Primary Examiner* — Michael C Zarroli
(74) *Attorney, Agent, or Firm* — McDonnell Boehnen Hulbert & Berghoff LLP

(57) ABSTRACT

A method includes charging a battery of a vehicle to a charge threshold voltage. The method also includes discharging the battery from the charge threshold voltage to a post-task voltage by performing a travel task using the vehicle. The method additionally includes determining that a battery calibration condition has been met. The method further includes, based on determining that the battery calibration condition has been met, discharging the battery from the post-task voltage to a discharge threshold voltage by performing a battery discharge task. The method yet further includes determining a capacity of the battery based on a first electrical output of the battery during the travel task and a second electrical output of the battery during the battery discharge task.

20 Claims, 11 Drawing Sheets

VEHICLE BATTERY CAPACITY MEASUREMENT USING AUTONOMOUS DISCHARGE

BACKGROUND

Batteries may be utilized as a power source by vehicles, including uncrewed aerial vehicles. The output of a battery may vary due to various reasons, including manufacturing differences among batteries, degradations due to usage and/ or aging, and/or operation of the battery under adverse conditions. Thus, it may be beneficial to have an accurate estimate of various aspects of a condition of a battery, including an energy storage capacity of the battery.

SUMMARY

A battery may be used to power a vehicle. A capacity of the battery may deteriorate over the battery's lifetime. Since such deterioration may be affected by a variety of factors, there may be at least some uncertainty about the capacity of the battery at any given point in time. As such, it may be beneficial to perform battery calibrations that include accurately determining the capacity of the battery at different points during the lifetime of the battery. Specifically, the battery may be calibrated and/or recalibrated based on and/or in response to determining that a battery calibration condition has been met. The capacity of the battery may be determined based on a first electrical output of the battery measured during a travel task performed by the vehicle and a second electrical output of the battery measured during a battery discharge task performed by the vehicle.

In a first example embodiment, a method may include charging a battery of a vehicle to a charge threshold voltage. The method may also include discharging the battery from the charge threshold voltage to a post-task voltage by performing a travel task using the vehicle. The method may additionally include determining that a battery calibration condition has been met. The method may further include, based on determining that the battery calibration condition has been met, discharging the battery from the post-task voltage to a discharge threshold voltage by performing a battery discharge task. The method may yet further include determining a capacity of the battery based on a first electrical output of the battery during the travel task and a second electrical output of the battery during the battery discharge task.

In a second example embodiment, a system may include a processor and a non-transitory computer-readable storage medium having stored thereon instructions that, when executed by the processor, cause the processor to perform operations in accordance with the first example embodiment.

In a third example embodiment, a non-transitory computer-readable storage medium may have stored thereon instructions that, when executed by a computing system, cause the computing system to perform operations in accordance with the first example embodiment.

In a fourth example embodiment, a system may include various means for carrying out each of the operations of the first example embodiment.

These, as well as other embodiments, aspects, advantages, and alternatives, will become apparent to those of ordinary skill in the art by reading the following detailed description, with reference where appropriate to the accompanying drawings. Further, this summary and other descriptions and figures provided herein are intended to illustrate embodiments by way of example only and, as such, that numerous variations are possible. For instance, structural elements and process steps can be rearranged, combined, distributed, eliminated, or otherwise changed, while remaining within the scope of the embodiments as claimed.

DETAILED DESCRIPTION

Figure 1A:
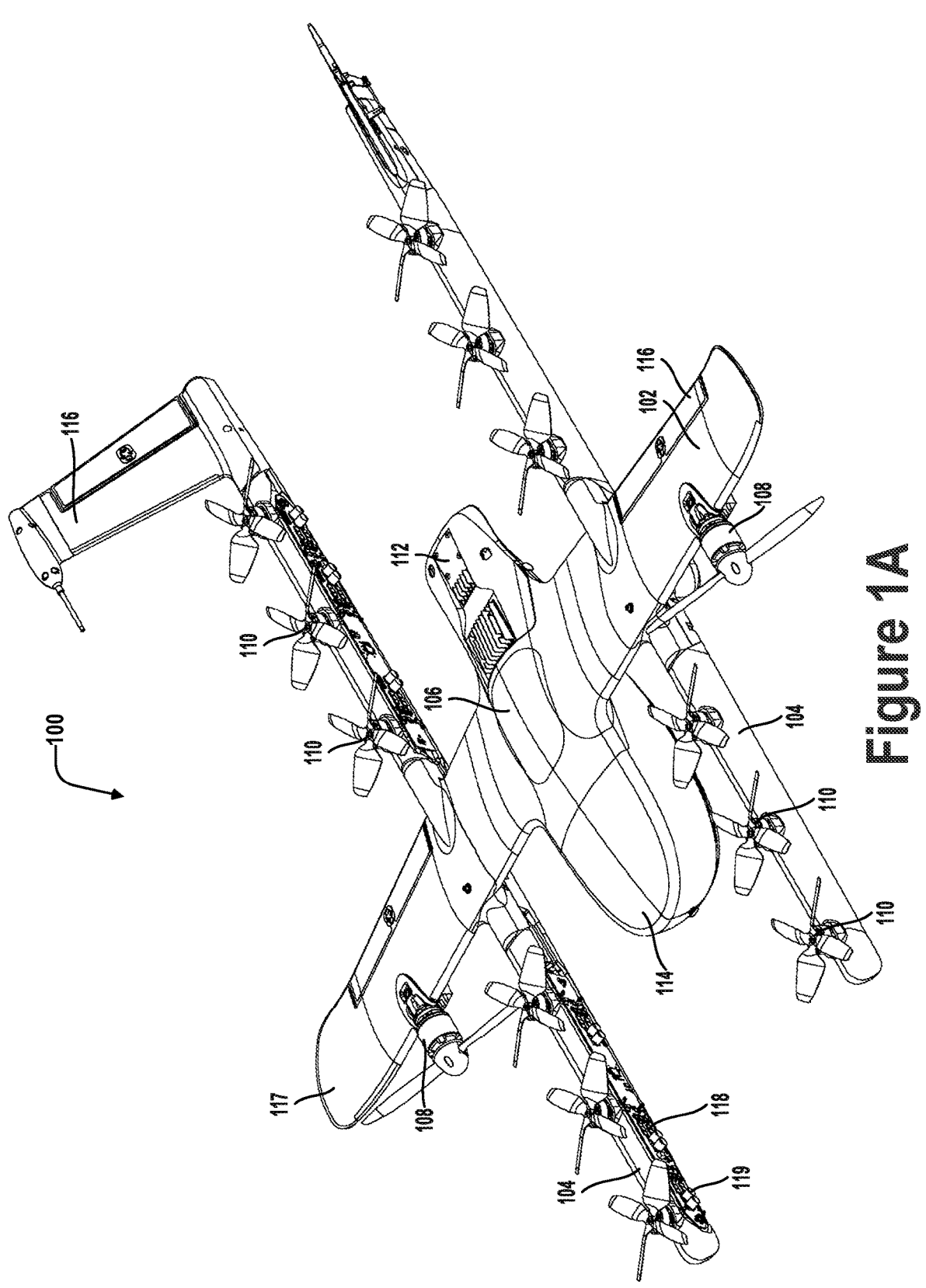
FIG. 1A illustrates an uncrewed aerial vehicle, in accordance with examples described herein.

Example methods, devices, and systems are described herein. It should be understood that the words "example" and "exemplary" are used herein to mean "serving as an example, instance, or illustration." Any embodiment or feature described herein as being an "example," "exemplary," and/or "illustrative" is not necessarily to be construed as preferred or advantageous over other embodiments or features unless stated as such. Thus, other embodiments can be utilized and other changes can be made without departing from the scope of the subject matter presented herein.

Accordingly, the example embodiments described herein are not meant to be limiting. It will be readily understood that the aspects of the present disclosure, as generally described herein, and illustrated in the figures, can be arranged, substituted, combined, separated, and designed in a wide variety of different configurations.

Further, unless context suggests otherwise, the features illustrated in each of the figures may be used in combination with one another. Thus, the figures should be generally viewed as component aspects of one or more overall embodiments, with the understanding that not all illustrated features are necessary for each embodiment.

Additionally, any enumeration of elements, blocks, or steps in this specification or the claims is for purposes of clarity. Thus, such enumeration should not be interpreted to require or imply that these elements, blocks, or steps adhere to a particular arrangement or are carried out in a particular order. Unless otherwise noted, figures are not drawn to scale.

I. OVERVIEW

Calculating a capacity of a battery may involve discharging the battery from a charge threshold voltage to a discharge threshold voltage. A battery may be considered fully charged if it is at the charge threshold voltage, and may be considered fully discharged if it is at the discharge threshold voltage. The charge threshold voltage and/or the discharge threshold voltage of the battery may be based on and/or correspond to a chemistry of the battery, manufacturer specifications, desired battery lifetime, desired battery output, and/or user selection, among other factors.

In some cases, it may be possible to increase the charge threshold voltage and/or decrease the discharge threshold voltage to extract additional capacity from the battery, possibly at the cost of shortening the lifetime of the battery. Similarly, it may be possible to decrease the charge threshold voltage and/or increase the discharge threshold voltage to extend the lifetime of the battery, possibly at the cost of reduced capacity per charge. Thus, the charge threshold voltage and the discharge threshold voltage may correspond, respectively, to the fully charged state and the fully discharged state for a given battery lifetime.

Charging the battery to its charge threshold voltage and then discharging the battery to its discharge threshold voltage solely for the sake of calculating the capacity of the battery may be wasteful because (i) this process degrades the battery by performing a complete charge and discharge cycle, (ii) wastes the energy discharged by the battery, and (iii) takes up time during which a vehicle powered by the battery might not be usable. As such, it is beneficial to first discharge the battery from the charge threshold voltage by performing a travel task using the vehicle. Completing the travel task may contribute to a useful purpose of the vehicle, and thus a first electrical output (e.g., current and/or energy) of the battery can be measured during the travel task without wasting the output of the battery and/or unnecessarily cycling the battery.

Following the travel task, the battery may be at a post-task voltage, and a battery discharge task may be performed to discharge the battery from the post-task voltage to the discharge voltage. A second electrical output of the battery may be measured during the battery discharge task. The first electrical output and the second electrical output may be used to calculate the battery capacity, which may accurately represent the battery's ability to store energy at a corresponding point in its lifetime. By discharging most of the battery using the travel task, and then discharging the battery the rest of the way using the battery discharge task, most of the battery's capacity may be utilized in a productive manner while allowing the battery to be completely discharged in a safe manner.

In some embodiments, a battery calibration condition may be considered between the travel task and the battery discharge task. Specifically, the battery discharge task may be performed based on and/or in response to determining that the battery calibration condition has been met. In one example, the battery calibration condition may be related to a state of charge of the battery after the travel task. Specifically, the battery calibration condition may specify a partial discharge threshold voltage that allows the battery discharge task to be completed in under a discharge time threshold. Thus, the discharge task may be performed if the post-task voltage is below the partial discharge threshold, and the discharge task might not be performed if the post-task voltage is not below the partial discharge threshold, thereby reducing and/or minimizing the amount of battery output spent on non-travel tasks.

In another example, the battery calibration condition may be based on factors indicative of a likelihood that a previously-measured capacity of the battery is no longer sufficiently accurate, including factors such as conditions in an environment that the battery has been operating in (e.g., temperature, humidity, etc.), an amount of time and/or charge/discharge cycles since the battery's last calibration, and/or any abnormalities in physical and/or electrical characteristics of the battery. In a further example, the battery calibration condition may be based on factors indicative of a degree of convenience with which the calibration may be performed, including factors such as whether there is enough time for the battery to go through the calibration process, a number of travel tasks assigned to and/or expected to be assigned to the vehicle utilizing the battery and/or a fleet of vehicles of which the vehicle is part.

II. EXAMPLE UNCREWED VEHICLES

Herein, the terms "uncrewed aerial system," "unmanned aerial system," and "UAV" refer to any autonomous or semi-autonomous vehicle that is capable of performing some functions without a physically present human pilot. A UAV can take various forms. For example, a UAV may take the form of a fixed-wing aircraft, a glider aircraft, a tail-sitter aircraft, a jet aircraft, a ducted fan aircraft, a lighter-than-air dirigible such as a blimp or steerable balloon, a rotorcraft such as a helicopter or multicopter, and/or an ornithopter, among other possibilities. Further, the terms "drone," "uncrewed aerial vehicle" "unmanned aerial vehicle system" (UAVS), or "unmanned aerial vehicle" may also be used to refer to a UAV.

FIG. 1A is an isometric view of an example UAV 100. UAV 100 includes wing 102, booms 104, and a fuselage 106. Wings 102 may be stationary and may generate lift based on the wing shape and the UAV's forward airspeed. For instance, the two wings 102 may have an airfoil-shaped cross section to produce an aerodynamic force on UAV 100. In some embodiments, wing 102 may carry horizontal propulsion units 108, and booms 104 may carry vertical propulsion units 110. In operation, power for the propulsion units may be provided from a battery compartment 112 of fuselage 106. In some embodiments, fuselage 106 also includes an avionics compartment 114, an additional battery compartment (not shown) and/or a delivery unit (not shown, e.g., a winch system) for handling the payload. In some embodiments, fuselage 106 is modular, and two or more compartments (e.g., battery compartment 112, avionics compartment 114, other payload and delivery compartments) are detachable from each other and securable to each other (e.g., mechanically, magnetically, or otherwise) to contiguously form at least a portion of fuselage 106.

In some embodiments, booms 104 terminate in rudders 116 for improved yaw control of UAV 100. Further, wings 102 may terminate in wing tips 117 for improved control of lift of the UAV.

In the illustrated configuration, UAV 100 includes a structural frame. The structural frame may be referred to as a "structural H-frame" or an "H-frame" (not shown) of the UAV. The H-frame may include, within wings 102, a wing spar (not shown) and, within booms 104, boom carriers (not shown). In some embodiments the wing spar and the boom carriers may be made of carbon fiber, hard plastic, aluminum, light metal alloys, or other materials. The wing spar and the boom carriers may be connected with clamps. The wing spar may include pre-drilled holes for horizontal propulsion units 108, and the boom carriers may include pre-drilled holes for vertical propulsion units 110.

In some embodiments, fuselage 106 may be removably attached to the H-frame (e.g., attached to the wing spar by clamps, configured with grooves, protrusions or other features to mate with corresponding H-frame features, etc.). In other embodiments, fuselage 106 similarly may be removably attached to wings 102. The removable attachment of fuselage 106 may improve quality and or modularity of UAV 100. For example, electrical/mechanical components and/or subsystems of fuselage 106 may be tested separately from, and before being attached to, the H-frame. Similarly, printed circuit boards (PCBs) 118 may be tested separately from, and before being attached to, the boom carriers, therefore eliminating defective parts/subassemblies prior to completing the UAV. For example, components of fuselage 106 (e.g., avionics, battery unit, delivery units, an additional battery compartment, etc.) may be electrically tested before fuselage 106 is mounted to the H-frame. Furthermore, the motors and the electronics of PCBs 118 may also be electrically tested before the final assembly. Generally, the identification of the defective parts and subassemblies early in the assembly process lowers the overall cost and lead time of the UAV. Furthermore, different types/models of fuselage 106 may be attached to the H-frame, therefore improving the modularity of the design. Such modularity allows these various parts of UAV 100 to be upgraded without a substantial overhaul to the manufacturing process.

In some embodiments, a wing shell and boom shells may be attached to the H-frame by adhesive elements (e.g., adhesive tape, double-sided adhesive tape, glue, etc.). Therefore, multiple shells may be attached to the H-frame instead of having a monolithic body sprayed onto the H-frame. In some embodiments, the presence of the multiple shells reduces the stresses induced by the coefficient of thermal expansion of the structural frame of the UAV. As a result, the UAV may have better dimensional accuracy and/or improved reliability.

Moreover, in at least some embodiments, the same H-frame may be used with the wing shell and/or boom shells having different size and/or design, therefore improving the modularity and versatility of the UAV designs. The wing shell and/or the boom shells may be made of relatively light polymers (e.g., closed cell foam) covered by the harder, but relatively thin, plastic skins.

The power and/or control signals from fuselage 106 may be routed to PCBs 118 through cables running through fuselage 106, wings 102, and booms 104. In the illustrated embodiment, UAV 100 has four PCBs, but other numbers of PCBs are also possible. For example, UAV 100 may include two PCBs, one per the boom. The PCBs carry electronic components 119 including, for example, power converters, controllers, memory, passive components, etc. In operation, propulsion units 108 and 110 of UAV 100 are electrically connected to the PCBs.

Many variations on the illustrated UAV are possible. For instance, fixed-wing UAVs may include more or fewer rotor units (vertical or horizontal), and/or may utilize a ducted fan or multiple ducted fans for propulsion. Further, UAVs with more wings (e.g., an "x-wing" configuration with four wings), are also possible. Although FIG. 1 illustrates two wings 102, two booms 104, two horizontal propulsion units 108, and six vertical propulsion units 110 per boom 104, it should be appreciated that other variants of UAV 100 may be implemented with more or less of these components. For example, UAV 100 may include four wings 102, four booms 104, and more or less propulsion units (horizontal or vertical).

Figure 1B:
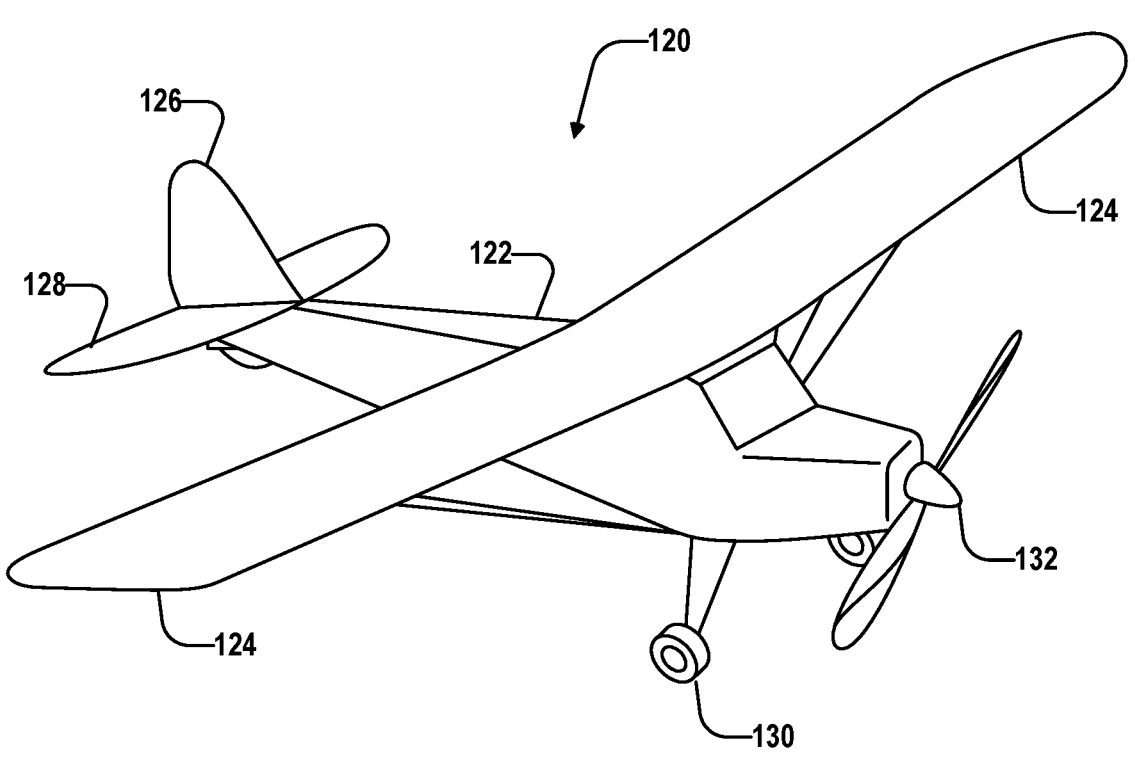
FIG. 1B illustrates an uncrewed aerial vehicle, in accordance with examples described herein.

Similarly, FIG. 1B shows another example of a fixed-wing UAV 120. Fixed-wing UAV 120 includes fuselage 122, two wings 124 with an airfoil-shaped cross section to provide lift for UAV 120, vertical stabilizer 126 (or fin) to stabilize the plane's yaw (turn left or right), horizontal stabilizer 128 (also referred to as an elevator or tailplane) to stabilize pitch (tilt up or down), landing gear 130, and propulsion unit 132, which can include a motor, shaft, and propeller.

Figure 1C:
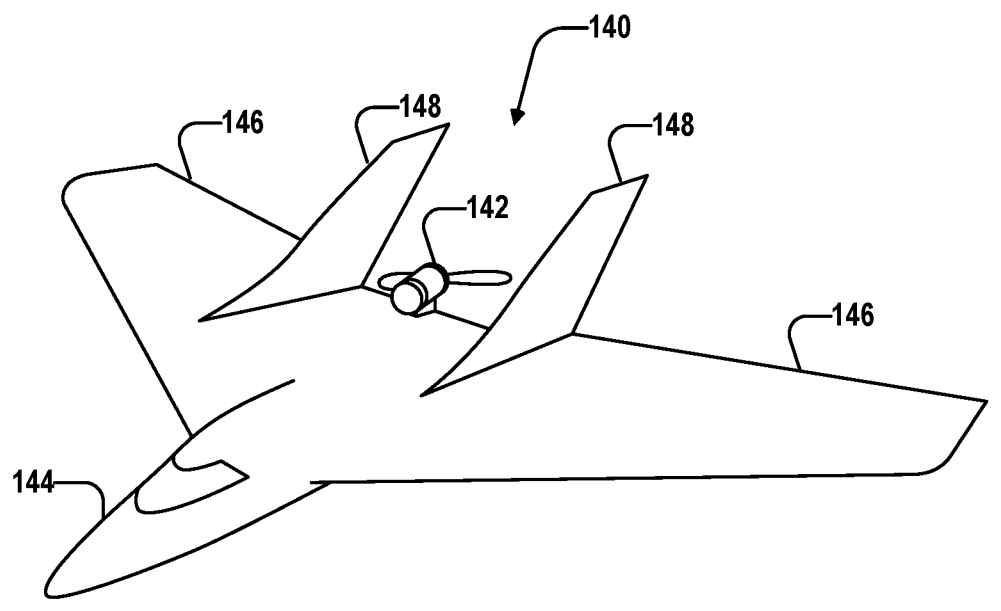
FIG. 1C illustrates an uncrewed aerial vehicle, in accordance with examples described herein.

FIG. 1C shows an example of UAV 140 with a propeller in a pusher configuration. The term "pusher" refers to the fact that propulsion unit 142 is mounted at the back of UAV 140 and "pushes" the vehicle forward, in contrast to the propulsion unit 142 being mounted at the front of UAV 140. Similar to the description provided for FIGS. 1A and 1B, FIG. 1C depicts common structures used in a pusher plane, including fuselage 144, two wings 146, vertical stabilizers 148, and propulsion unit 142, which can include a motor, shaft, and propeller.

Figure 1D:
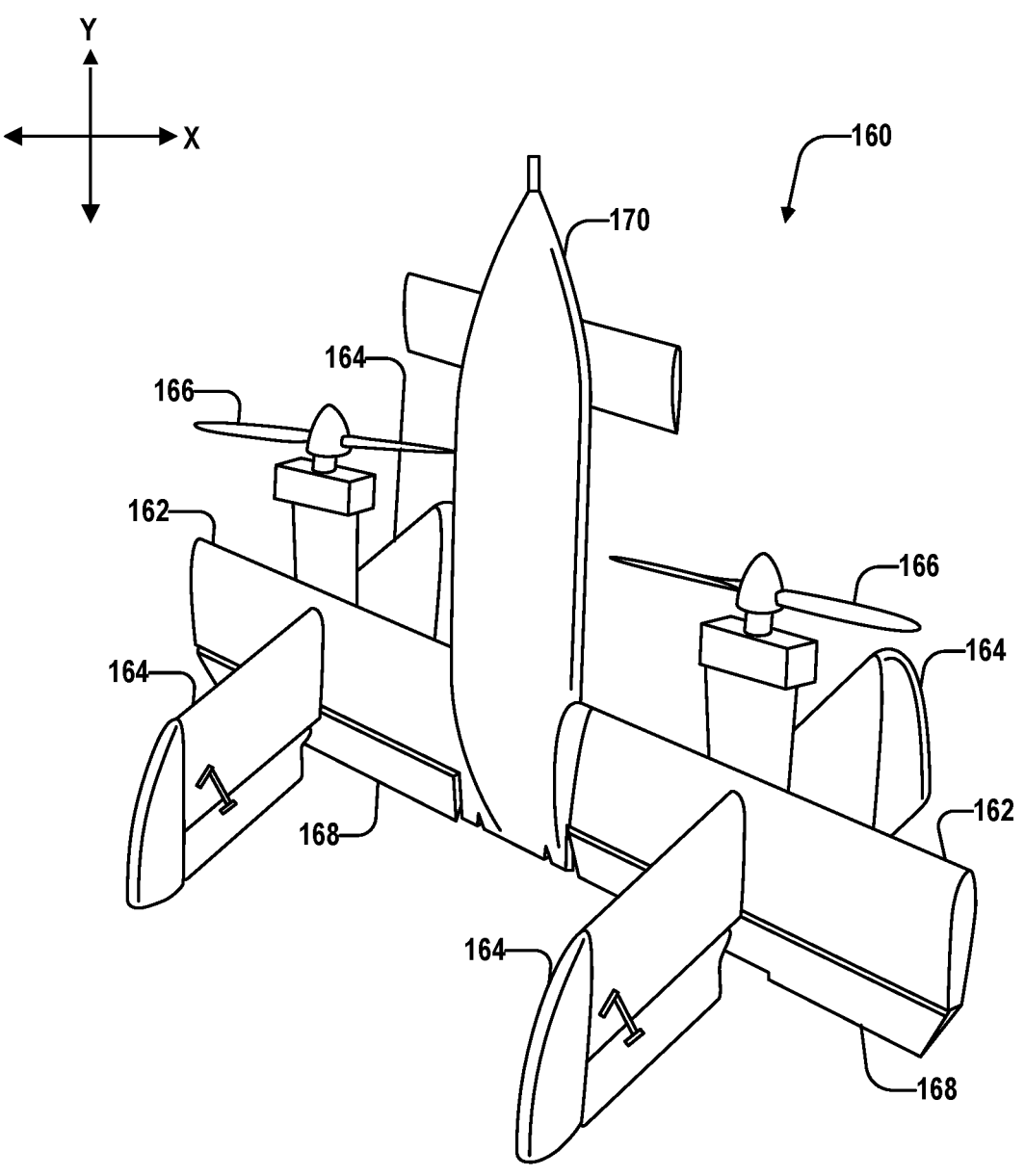
FIG. 1D illustrates an uncrewed aerial vehicle, in accordance with examples described herein.

FIG. 1D shows an example tail-sitter UAV 160. In the illustrated example, tail-sitter UAV 160 has fixed wings 162 to provide lift and allow UAV 160 to glide horizontally (e.g., along the x-axis, in a position that is approximately perpendicular to the position shown in FIG. 1D). However, fixed wings 162 also allow tail-sitter UAV 160 to take off and land vertically on its own.

For example, at a launch site, tail-sitter UAV 160 may be positioned vertically (as shown) with fins 164 and/or wings 162 resting on the ground and stabilizing UAV 160 in the vertical position. Tail-sitter UAV 160 may then take off by operating propellers 166 to generate an upward thrust (e.g., a thrust that is generally along the y-axis). Once at a suitable altitude, tail-sitter UAV 160 may use flaps 168 to reorient itself in a horizontal position, such that fuselage 170 is closer to being aligned with the x-axis than the y-axis. Positioned horizontally, propellers 166 may provide forward thrust so that tail-sitter UAV 160 can fly in a similar manner as a typical airplane.

Many variations on the illustrated fixed-wing UAVs are possible. For instance, fixed-wing UAVs may include more or fewer propellers, and/or may utilize a ducted fan or multiple ducted fans for propulsion. Further, UAVs with more wings (e.g., an "x-wing" configuration with four wings), with fewer wings, or even with no wings, are also possible.

Figure 1E:
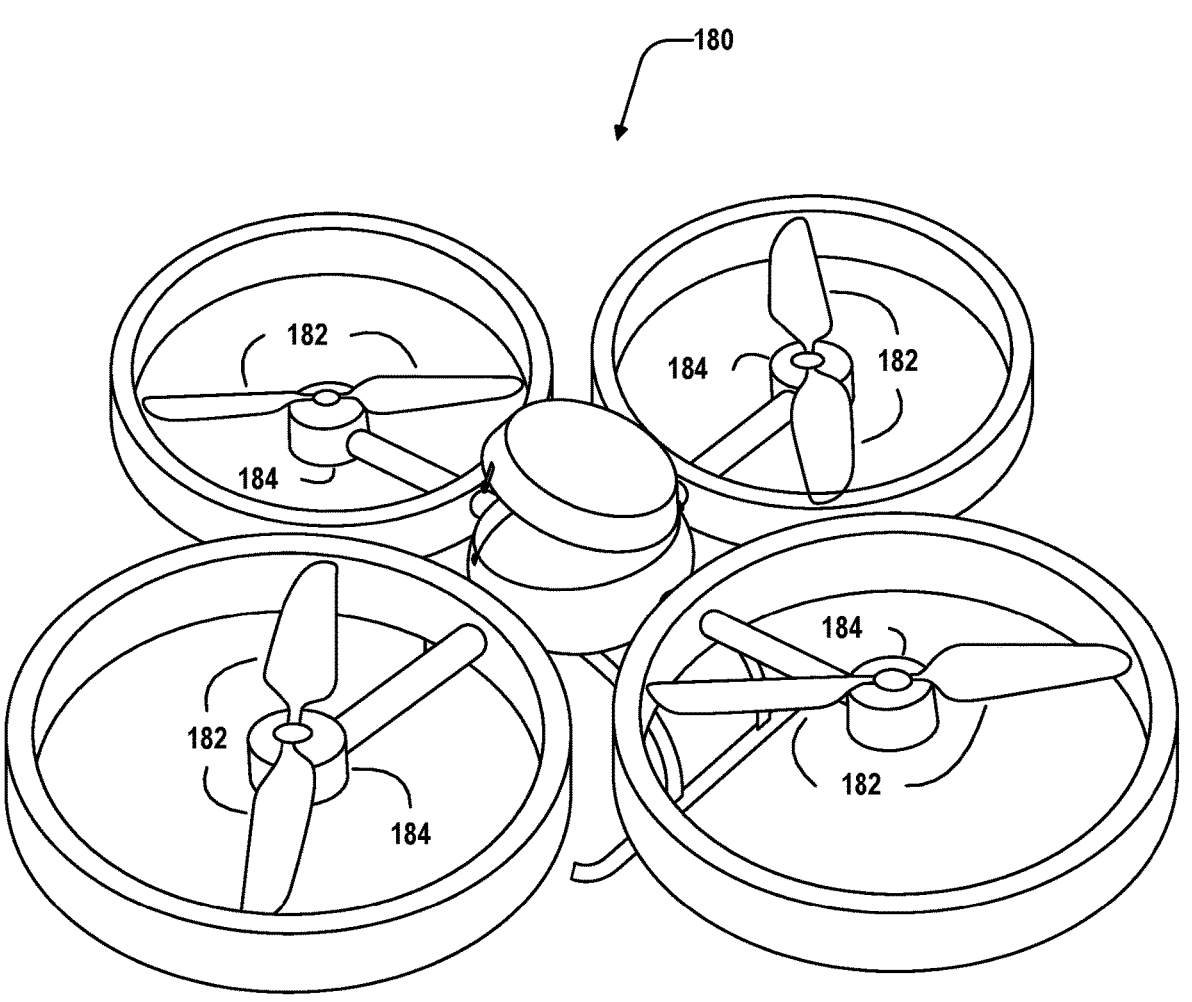
FIG. 1E illustrates an uncrewed aerial vehicle, in accordance with examples described herein.

As noted above, some embodiments may involve other types of UAVs, in addition to or in the alternative to fixed-wing UAVs. For instance, FIG. 1E shows an example of rotorcraft 180 that is commonly referred to as a multicopter. Multicopter 180 may also be referred to as a quadcopter, as it includes four rotors 182. It should be understood that example embodiments may involve a rotorcraft with more or fewer rotors than multicopter 180. For example, a helicopter typically has two rotors. Other examples with three or more rotors are possible as well. Herein, the term "multicopter" refers to any rotorcraft having more than two rotors, and the term "helicopter" refers to rotorcraft having two rotors.

Referring to multicopter 180 in greater detail, four rotors 182 provide propulsion and maneuverability for multicopter 180. More specifically, each rotor 182 includes blades that are attached to motor 184. Configured as such, rotors 182 may allow multicopter 180 to take off and land vertically, to maneuver in any direction, and/or to hover. Further, the pitch of the blades may be adjusted as a group and/or differentially, and may allow multicopter 180 to control its pitch, roll, yaw, and/or altitude.

It should be understood that references herein to an "uncrewed" and/or "unmanned" aerial vehicle or UAV can apply equally to autonomous and semi-autonomous aerial vehicles. In an autonomous implementation, all functionality of the aerial vehicle is automated; e.g., pre-programmed or controlled via real-time computer functionality that responds to input from various sensors and/or pre-determined information. In a semi-autonomous implementation, some functions of an aerial vehicle may be controlled by a human operator, while other functions are carried out autonomously. Further, in some embodiments, a UAV may be configured to allow a remote operator to take over functions that can otherwise be controlled autonomously by the UAV. Yet further, a given type of function may be controlled remotely at one level of abstraction and performed autonomously at another level of abstraction. For example, a remote operator could control high level navigation decisions for a UAV, such as by specifying that the UAV should travel from one location to another (e.g., from a warehouse in a suburban area to a delivery address in a nearby city), while the UAV's navigation system autonomously controls more fine-grained navigation decisions, such as the specific route to take between the two locations, specific flight controls to achieve the route and avoid obstacles while navigating the route, and so on.

More generally, it should be understood that the example UAVs described herein are not intended to be limiting. Example embodiments may relate to, be implemented within, or take the form of any type of uncrewed aerial vehicle.

III. EXAMPLE UAV COMPONENTS

Figure 2:
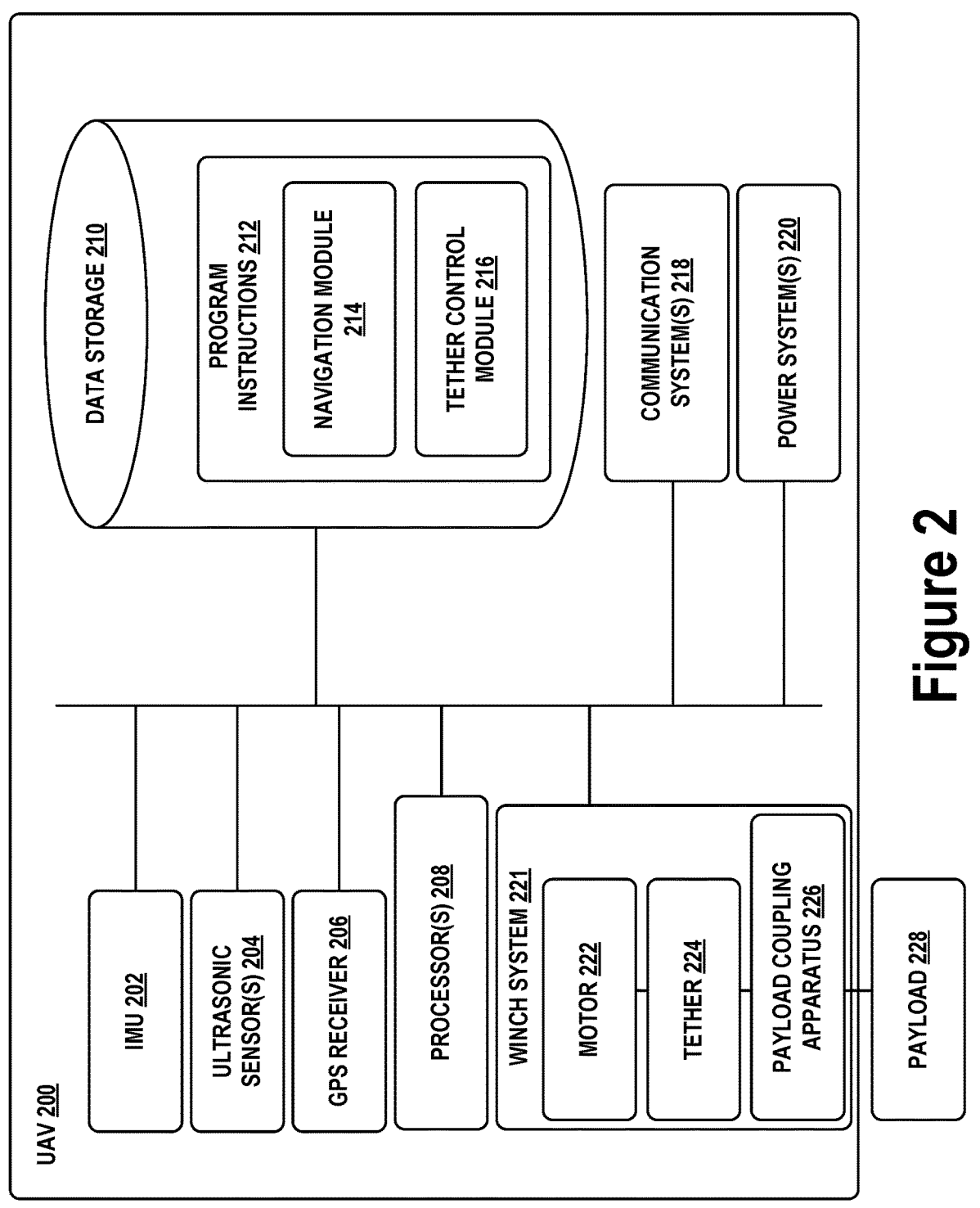
FIG. 2 illustrates components of an uncrewed aerial system, in accordance with examples described herein.

FIG. 2 is a simplified block diagram illustrating components of UAV 200, according to an example embodiment. UAV 200 may take the form of, or be similar in form to, one of UAVs 100, 120, 140, 160, and 180 described in reference to FIGS. 1A-1E. However, UAV 200 may also take other forms.

UAV 200 may include various types of sensors, and may include a computing system configured to provide the functionality described herein. In the illustrated embodiment, the sensors of UAV 200 include inertial measurement unit (IMU) 202, ultrasonic sensor(s) 204, and GPS receiver 206, among other possible sensors and sensing systems.

In the illustrated embodiment, UAV 200 also includes processor(s) 208. Processor 208 may be a general-purpose processor or a special purpose processor (e.g., digital signal processors, application specific integrated circuits, etc.). Processor(s) 208 can be configured to execute computer-readable program instructions 212 that are stored in data storage 210 and are executable to provide the functionality of a UAV described herein.

Data storage 210 may include or take the form of one or more computer-readable storage media that can be read or accessed by at least one processor 208. The one or more computer-readable storage media can include volatile and/or non-volatile storage components, such as optical, magnetic, organic or other memory or disc storage, which can be integrated in whole or in part with at least one of processor(s) 208. In some embodiments, data storage 210 can be implemented using a single physical device (e.g., one optical, magnetic, organic or other memory or disc storage unit), while in other embodiments, data storage 210 can be implemented using two or more physical devices.

As noted, data storage 210 can include computer-readable program instructions 212 and perhaps additional data, such as diagnostic data of UAV 200. As such, data storage 210 may include program instructions 212 to perform or facilitate some or all of the UAV functionality described herein.

For instance, in the illustrated embodiment, program instructions 212 include navigation module 214 and tether control module 216.

In an illustrative embodiment, IMU 202 may include both an accelerometer and a gyroscope, which may be used together to determine an orientation of UAV 200. In particular, the accelerometer can measure the orientation of the vehicle with respect to earth, while the gyroscope measures the rate of rotation around an axis. IMUs are commercially available in low-cost, low-power packages. For instance, IMU 202 may take the form of or include a miniaturized MicroElectroMechanical System (MEMS) or a NanoElectroMechanical System (NEMS). Other types of IMUs may also be utilized.

IMU 202 may include other sensors, in addition to accelerometers and gyroscopes, which may help to better determine position and/or help to increase autonomy of UAV 200. Two examples of such sensors are magnetometers and pressure sensors. In some embodiments, a UAV may include a low-power, digital 3-axis magnetometer, which can be used to realize an orientation independent electronic compass for accurate heading information. However, other types of magnetometers may be utilized as well. Other examples are also possible. Further, note that a UAV could include some or all of the above-described inertia sensors as separate components from an IMU.

UAV 200 may also include a pressure sensor or barometer, which can be used to determine the altitude of UAV 200. Alternatively, other sensors, such as sonic altimeters or radar altimeters, can be used to provide an indication of altitude, which may help to improve the accuracy of and/or prevent drift of an IMU.

In a further aspect, UAV 200 may include one or more sensors that allow the UAV to sense objects in the environment. For instance, in the illustrated embodiment, UAV 200 includes ultrasonic sensor(s) 204. Ultrasonic sensor(s) 204 can determine the distance to an object by generating sound waves and determining the time interval between transmission of the wave and receiving the corresponding echo off an object. A typical application of an ultrasonic sensor for uncrewed vehicles or IMUs is low-level altitude control and obstacle avoidance. An ultrasonic sensor can also be used for vehicles that need to hover at a certain height or need to be capable of detecting obstacles. Other systems can be used to determine, sense the presence of, and/or determine the distance to nearby objects, such as a light detection and ranging (LIDAR) system, laser detection and ranging (LADAR) system, and/or an infrared or forward-looking infrared (FLIR) system, among other possibilities.

In some embodiments, UAV 200 may also include one or more imaging system(s). For example, one or more still and/or video cameras may be utilized by UAV 200 to capture image data from the UAV's environment. As a specific example, charge-coupled device (CCD) cameras or complementary metal-oxide-semiconductor (CMOS) cameras can be used with uncrewed vehicles. Such imaging sensor(s) have numerous possible applications, such as obstacle avoidance, localization techniques, ground tracking for more accurate navigation (e.g., by applying optical flow techniques to images), video feedback, and/or image recognition and processing, among other possibilities.

UAV 200 may also include GPS receiver 206. GPS receiver 206 may be configured to provide data that is typical of well-known GPS systems, such as the GPS coordinates of UAV 200. Such GPS data may be utilized by UAV 200 for various functions. As such, the UAV may use GPS receiver 206 to help navigate to the caller's location, as indicated, at least in part, by the GPS coordinates provided by their mobile device. Other examples are also possible.

Navigation module 214 may provide functionality that allows UAV 200 to, for example, move about its environment and reach a desired location. To do so, navigation module 214 may control the altitude and/or direction of flight by controlling the mechanical features of the UAV that affect flight (e.g., its rudder(s), elevator(s), aileron(s), and/or the speed of its propeller(s)).

In order to navigate UAV 200 to a target location, navigation module 214 may implement various navigation techniques, such as map-based navigation and localization-based navigation, for instance. With map-based navigation, UAV 200 may be provided with a map of its environment, which may then be used to navigate to a particular location on the map. With localization-based navigation, UAV 200 may be capable of navigating in an unknown environment using localization. Localization-based navigation may involve UAV 200 building its own map of its environment and calculating its position within the map and/or the position of objects in the environment. For example, as UAV 200 moves throughout its environment, UAV 200 may continuously use localization to update its map of the environment. This continuous mapping process may be referred to as simultaneous localization and mapping (SLAM). Other navigation techniques may also be utilized.

In some embodiments, navigation module 214 may navigate using a technique that relies on waypoints. In particular, waypoints are sets of coordinates that identify points in physical space. For instance, an air-navigation waypoint may be defined by a certain latitude, longitude, and altitude. Accordingly, navigation module 214 may cause UAV 200 to move from waypoint to waypoint, in order to ultimately travel to a final destination (e.g., a final waypoint in a sequence of waypoints).

In a further aspect, navigation module 214 and/or other components and systems of UAV 200 may be configured for "localization" to more precisely navigate to the scene of a target location. More specifically, it may be desirable in certain situations for a UAV to be within a threshold distance of the target location where payload 228 is being delivered by a UAV (e.g., within a few feet of the target destination). To this end, a UAV may use a two-tiered approach in which it uses a more-general location-determination technique to navigate to a general area that is associated with the target location, and then use a more-refined location-determination technique to identify and/or navigate to the target location within the general area.

For example, UAV 200 may navigate to the general area of a target destination where payload 228 is being delivered using waypoints and/or map-based navigation. The UAV may then switch to a mode in which it utilizes a localization process to locate and travel to a more specific location. For instance, if UAV 200 is to deliver a payload to a user's home, UAV 200 may need to be substantially close to the target location in order to avoid delivery of the payload to undesired areas (e.g., onto a roof, into a pool, onto a neighbor's property, etc.). However, a GPS signal may only get UAV 200 so far (e.g., within a block of the user's home). A more precise location-determination technique may then be used to find the specific target location.

Various types of location-determination techniques may be used to accomplish localization of the target delivery location once UAV 200 has navigated to the general area of the target delivery location. For instance, UAV 200 may be equipped with one or more sensory systems, such as, for example, ultrasonic sensors 204, infrared sensors (not shown), and/or other sensors, which may provide input that navigation module 214 utilizes to navigate autonomously or semi-autonomously to the specific target location.

As another example, once UAV 200 reaches the general area of the target delivery location (or of a moving subject such as a person or their mobile device), UAV 200 may switch to a "fly-by-wire" mode where it is controlled, at least in part, by a remote operator, who can navigate UAV 200 to the specific target location. To this end, sensory data from UAV 200 may be sent to the remote operator to assist them in navigating UAV 200 to the specific location.

As yet another example, UAV 200 may include a module that is able to signal to a passer-by for assistance in reaching the specific target delivery location. For example, the UAV 200 may display a visual message requesting such assistance in a graphic display or play an audio message or tone through speakers to indicate the need for such assistance, among other possibilities. Such a visual or audio message might indicate that assistance is needed in delivering UAV 200 to a particular person or a particular location, and might provide information to assist the passer-by in delivering UAV 200 to the person or location (e.g., a description or picture of the person or location, and/or the person or location's name), among other possibilities. Such a feature can be useful in a scenario in which the UAV is unable to use sensory functions or another location-determination technique to reach the specific target location. However, this feature is not limited to such scenarios.

In some embodiments, once UAV 200 arrives at the general area of a target delivery location, UAV 200 may utilize a beacon from a user's remote device (e.g., the user's mobile phone) to locate the person. Such a beacon may take various forms. As an example, consider the scenario where a remote device, such as the mobile phone of a person who requested a UAV delivery, is able to send out directional signals (e.g., via an RF signal, a light signal and/or an audio signal). In this scenario, UAV 200 may be configured to navigate by "sourcing" such directional signals—in other words, by determining where the signal is strongest and navigating accordingly. As another example, a mobile device can emit a frequency, either in the human range or outside the human range, and UAV 200 can listen for that frequency and navigate accordingly. As a related example, if UAV 200 is listening for spoken commands, then UAV 200 could utilize spoken statements, such as "I'm over here!" to source the specific location of the person requesting delivery of a payload.

In an alternative arrangement, a navigation module may be implemented at a remote computing device, which communicates wirelessly with UAV 200. The remote computing device may receive data indicating the operational state of UAV 200, sensor data from UAV 200 that allows it to assess the environmental conditions being experienced by UAV 200, and/or location information for UAV 200. Provided with such information, the remote computing device may determine altitudinal and/or directional adjustments that should be made by UAV 200 and/or may determine how UAV 200 should adjust its mechanical features (e.g., its rudder(s), elevator(s), aileron(s), and/or the speed of its propeller(s)) in order to effectuate such movements. The remote computing system may then communicate such adjustments to UAV 200 so it can move in the determined manner.

In a further aspect, UAV 200 includes one or more communication system(s) 218. Communications system(s) 218 may include one or more wireless interfaces and/or one or more wireline interfaces, which allow UAV 200 to communicate via one or more networks. Such wireless interfaces may provide for communication under one or more wireless communication protocols, such as Bluetooth, WiFi (e.g., an IEEE 802.11 protocol), Long-Term Evolution (LTE), WiMAX (e.g., an IEEE 802.16 standard), a radio-frequency ID (RFID) protocol, near-field communication (NFC), and/or other wireless communication protocols. Such wireline interfaces may include an Ethernet interface, a Universal Serial Bus (USB) interface, or similar interface to communicate via a wire, a twisted pair of wires, a coaxial cable, an optical link, a fiber-optic link, or other physical connection to a wireline network.

In some embodiments, UAV 200 may include communication systems 218 that allow for both short-range communication and long-range communication. For example, UAV 200 may be configured for short-range communications using Bluetooth and for long-range communications under a CDMA protocol. In such an embodiment, UAV 200 may be configured to function as a "hot spot;" or in other words, as a gateway or proxy between a remote support device and one or more data networks, such as a cellular network and/or the Internet. Configured as such, UAV 200 may facilitate data communications that the remote support device would otherwise be unable to perform by itself.

For example, UAV 200 may provide a WiFi connection to a remote device, and serve as a proxy or gateway to a cellular service provider's data network, which the UAV might connect to under an LTE or a 3G protocol, for instance. UAV 200 could also serve as a proxy or gateway to a high-altitude balloon network, a satellite network, or a combination of these networks, among others, which a remote device might not be able to otherwise access.

In a further aspect, UAV 200 may include power system(s) 220. Power system(s) 220 may include one or more batteries for providing power to UAV 200. In one example, the one or more batteries may be rechargeable and each battery may be recharged via a wired connection between the battery and a power supply and/or via a wireless charging system, such as an inductive charging system that applies an external time-varying magnetic field to an internal battery.

UAV 200 may employ various systems and configurations in order to transport and deliver payload 228. In some implementations, payload 228 of UAV 200 may include or take the form of a "package" designed to transport various goods to a target delivery location. For example, UAV 200 can include a compartment, in which an item or items may be transported. Such a package may one or more food items, purchased goods, medical items, or any other object(s) having a size and weight suitable to be transported between two locations by the UAV. In other embodiments, payload 228 may simply be the one or more items that are being delivered (e.g., without any package housing the items).

In some embodiments, payload 228 may be attached to the UAV and located substantially outside of the UAV during some or all of a flight by the UAV. For example, the package may be tethered or otherwise releasably attached below the UAV during flight to a target location. In an embodiment where a package carries goods below the UAV, the package may include various features that protect its contents from the environment, reduce aerodynamic drag on the system, and prevent the contents of the package from shifting during UAV flight.

In order to deliver the payload, the UAV may include winch system 221 controlled by tether control module 216 in order to lower payload 228 to the ground while UAV 200 hovers above. As shown in FIG. 2, winch system 221 may include tether 224, and tether 224 may be coupled to payload 228 by payload coupling apparatus 226. Tether 224 may be wound on a spool that is coupled to motor 222 of the UAV. Motor 222 may take the form of a DC motor (e.g., a servo motor) that can be actively controlled by a speed controller. Tether control module 216 can control the speed controller to cause motor 222 to rotate the spool, thereby unwinding or retracting tether 224 and lowering or raising payload coupling apparatus 226. In practice, the speed controller may output a desired operating rate (e.g., a desired RPM) for the spool, which may correspond to the speed at which tether 224 and payload 228 should be lowered towards the ground. Motor 222 may then rotate the spool so that it maintains the desired operating rate.

In order to control motor 222 via the speed controller, tether control module 216 may receive data from a speed sensor (e.g., an encoder) configured to convert a mechanical position to a representative analog or digital signal. In particular, the speed sensor may include a rotary encoder that may provide information related to rotary position (and/or rotary movement) of a shaft of the motor or the spool coupled to the motor, among other possibilities. Moreover, the speed sensor may take the form of an absolute encoder and/or an incremental encoder, among others. So in an example implementation, as motor 222 causes rotation of the spool, a rotary encoder may be used to measure this rotation. In doing so, the rotary encoder may be used to convert a rotary position to an analog or digital electronic signal used by tether control module 216 to determine the amount of rotation of the spool from a fixed reference angle and/or to an analog or digital electronic signal that is representative of a new rotary position, among other options. Other examples are also possible.

Based on the data from the speed sensor, tether control module 216 may determine a rotational speed of motor 222 and/or the spool and responsively control motor 222 (e.g., by increasing or decreasing an electrical current supplied to motor 222) to cause the rotational speed of motor 222 to match a desired speed. When adjusting the motor current, the magnitude of the current adjustment may be based on a proportional-integral-derivative (PID) calculation using the determined and desired speeds of motor 222. For instance, the magnitude of the current adjustment may be based on a present difference, a past difference (based on accumulated error over time), and a future difference (based on current rates of change) between the determined and desired speeds of the spool.

In some embodiments, tether control module 216 may vary the rate at which tether 224 and payload 228 are lowered to the ground. For example, the speed controller may change the desired operating rate according to a variable deployment-rate profile and/or in response to other factors in order to change the rate at which payload 228 descends toward the ground. To do so, tether control module 216 may adjust an amount of braking or an amount of friction that is applied to tether 224. For example, to vary the tether deployment rate, UAV 200 may include friction pads that can apply a variable amount of pressure to tether 224. As another example, UAV 200 can include a motorized braking system that varies the rate at which the spool lets out tether 224. Such a braking system may take the form of an electromechanical system in which motor 222 operates to slow the rate at which the spool lets out tether 224. Further, motor 222 may vary the amount by which it adjusts the speed (e.g., the RPM) of the spool, and thus may vary the deployment rate of tether 224. Other examples are also possible.

In some embodiments, tether control module 216 may be configured to limit the motor current supplied to motor 222 to a maximum value. With such a limit placed on the motor current, there may be situations where motor 222 cannot operate at the desired rate specified by the speed controller. For instance, there may be situations where the speed controller specifies a desired operating rate at which motor 222 should retract tether 224 toward UAV 200, but the motor current may be limited such that a large enough downward force on tether 224 would counteract the retracting force of motor 222 and cause tether 224 to unwind instead. A limit on the motor current may be imposed and/or altered depending on an operational state of UAV 200.

In some embodiments, tether control module 216 may be configured to determine a status of tether 224 and/or payload 228 based on the amount of current supplied to motor 222. For instance, if a downward force is applied to tether 224 (e.g., if payload 228 is attached to tether 224 or if tether 224 gets snagged on an object when retracting toward UAV 200), tether control module 216 may need to increase the motor current in order to cause the determined rotational speed of motor 222 and/or spool to match the desired speed. Similarly, when the downward force is removed from tether 224 (e.g., upon delivery of payload 228 or removal of a tether snag), tether control module 216 may need to decrease the motor current in order to cause the determined rotational speed of motor 222 and/or spool to match the desired speed. As such, tether control module 216 may be configured to monitor the current supplied to motor 222. For instance, tether control module 216 could determine the motor current based on sensor data received from a current sensor of the motor or a current sensor of power system 220. In any case, based on the current supplied to motor 222, tether control module 216 may determine if payload 228 is attached to tether 224, if someone or something is pulling on tether 224, and/or if payload coupling apparatus 226 is pressing against UAV 200 after retracting tether 224. Other examples are possible as well.

During delivery of payload 228, payload coupling apparatus 226 can be configured to secure payload 228 while being lowered from the UAV by tether 224, and can be further configured to release payload 228 upon reaching ground level. Payload coupling apparatus 226 can then be retracted to the UAV by reeling in tether 224 using motor 222.

In some implementations, payload 228 may be passively released once it is lowered to the ground. For example, a passive release mechanism may include one or more swing arms adapted to retract into and extend from a housing. An extended swing arm may form a hook on which payload 228 may be attached. Upon lowering the release mechanism and payload 228 to the ground via a tether, a gravitational force as well as a downward inertial force on the release mechanism may cause payload 228 to detach from the hook allowing the release mechanism to be raised upwards toward the UAV. The release mechanism may further include a spring mechanism that biases the swing arm to retract into the housing when there are no other external forces on the swing arm. For instance, a spring may exert a force on the swing arm that pushes or pulls the swing arm toward the housing such that the swing arm retracts into the housing once the weight of payload 228 no longer forces the swing arm to extend from the housing. Retracting the swing arm into the housing may reduce the likelihood of the release mechanism snagging payload 228 or other nearby objects when raising the release mechanism toward the UAV upon delivery of payload 228.

Active payload release mechanisms are also possible. For example, sensors such as a barometric pressure based altimeter and/or accelerometers may help to detect the position of the release mechanism (and the payload) relative to the ground. Data from the sensors can be communicated back to the UAV and/or a control system over a wireless link and used to help in determining when the release mechanism has reached ground level (e.g., by detecting a measurement with the accelerometer that is characteristic of ground impact). In other examples, the UAV may determine that the payload has reached the ground based on a weight sensor detecting a threshold low downward force on the tether and/or based on a threshold low measurement of power drawn by the winch when lowering the payload.

Other systems and techniques for delivering a payload, in addition or in the alternative to a tethered delivery system are also possible. For example, UAV 200 could include an air-bag drop system or a parachute drop system. Alternatively, UAV 200 carrying a payload could simply land on the ground at a delivery location. Other examples are also possible.

IV. EXAMPLE UAV DEPLOYMENT SYSTEMS

Figure 3:
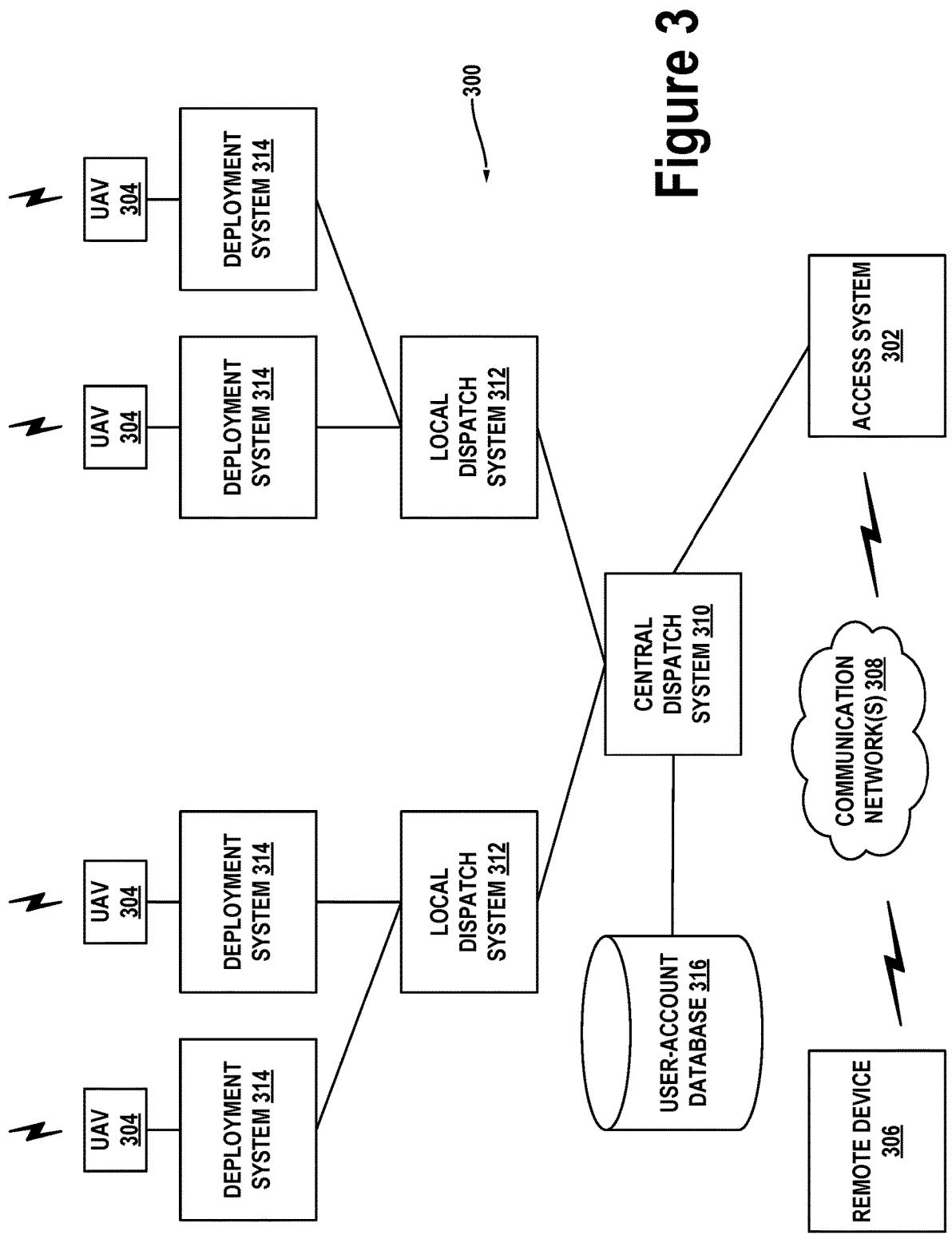
FIG. 3 is a block diagram illustrating a distributed UAV system, in accordance with examples described herein.

UAV systems may be implemented in order to provide various UAV-related services. In particular, UAVs may be provided at a number of different launch sites that may be in communication with regional and/or central control systems. Such a distributed UAV system may allow UAVs to be quickly deployed to provide services across a large geographic area (e.g., that is much larger than the flight range of any single UAV). For example, UAVs capable of carrying payloads may be distributed at a number of launch sites across a large geographic area (possibly even throughout an entire country, or even worldwide), in order to provide on-demand transport of various items to locations throughout the geographic area. FIG. 3 is a simplified block diagram illustrating a distributed UAV system 300, according to an example embodiment.

In the illustrative UAV system 300, access system 302 may allow for interaction with, control of, and/or utilization of a network of UA Vs 304. In some embodiments, access system 302 may be a computing system that allows for human-controlled dispatch of UAVs 304. As such, the control system may include or otherwise provide a user interface through which a user can access and/or control UAVs 304.

In some embodiments, dispatch of UAVs 304 may additionally or alternatively be accomplished via one or more automated processes. For instance, access system 302 may dispatch one of UAVs 304 to transport a payload to a target location, and the UAV may autonomously navigate to the target location by utilizing various on-board sensors, such as a GPS receiver and/or other various navigational sensors.

Further, access system 302 may provide for remote operation of a UAV. For instance, access system 302 may allow an operator to control the flight of a UAV via its user interface. As a specific example, an operator may use access system 302 to dispatch one of UAVs 304 to a target location. The dispatched UAV may then autonomously navigate to the general area of the target location. At this point, the operator may use access system 302 to take control of the dispatched UAV and navigate the dispatched UAV to the target location (e.g., to a particular person to whom a payload is being transported). Other examples of remote operation of a UAV are also possible.

In an illustrative embodiment, UAVs 304 may take various forms. For example, each of UAVs 304 may be a UAV such as those illustrated in FIG. 1A, 1B, 1C, 1D, 1E, or 2. However, UAV system 300 may also utilize other types of UAVs without departing from the scope of the invention. In some implementations, all of UAVs 304 may be of the same or a similar configuration. However, in other implementations, UAVs 304 may include a number of different types of UAVs. For instance, UAVs 304 may include a number of types of UAVs, with each type of UAV being configured for a different type or types of payload delivery capabilities.

UAV system 300 may further include remote device 306, which may take various forms. Generally, remote device 306 may be any device through which a direct or indirect request to dispatch a UAV can be made. Note that an indirect request may involve any communication that may be responded to by dispatching a UAV, such as requesting a package delivery. In an example embodiment, remote device 306 may be a mobile phone, tablet computer, laptop computer, personal computer, or any network-connected computing device. Further, in some instances, remote device 306 may not be a computing device. As an example, a standard telephone, which allows for communication via plain old telephone service (POTS), may serve as remote device 306. Other types of remote devices are also possible.

Further, remote device 306 may be configured to communicate with access system 302 via one or more types of communication network(s) 308. For example, remote device 306 may communicate with access system 302 (or a human operator of access system 302) by communicating over a POTS network, a cellular network, and/or a data network such as the Internet. Other types of networks may also be utilized.

In some embodiments, remote device 306 may be configured to allow a user to request pick-up of one or more items from a certain source location and/or delivery of one or more items to a desired location. For example, a user could request UAV delivery of a package to their home via their mobile phone, tablet, or laptop. As another example, a user could request dynamic delivery to wherever they are located at the time of delivery. To provide such dynamic delivery, UAV system 300 may receive location information (e.g., GPS coordinates, etc.) from the user's mobile phone, or any other device on the user's person, such that a UAV can navigate to the user's location (as indicated by their mobile phone).

In an illustrative arrangement, central dispatch system 310 may be a server or group of servers, which is configured to receive dispatch messages requests and/or dispatch instructions from access system 302. Such dispatch messages may request or instruct central dispatch system 310 to coordinate the deployment of UAVs to various target locations. Central dispatch system 310 may be further configured to route such requests or instructions to one or more local dispatch systems 312. To provide such functionality, central dispatch system 310 may communicate with access system 302 via a data network, such as the Internet or a private network that is established for communications between access systems and automated dispatch systems.

In the illustrated configuration, central dispatch system 310 may be configured to coordinate the dispatch of UAVs 304 from a number of different local dispatch systems 312. As such, central dispatch system 310 may keep track of which ones of UAVs 304 are located at which ones of local dispatch systems 312, which UAVs 304 are currently available for deployment, and/or which services or operations each of UAVs 304 is configured for (in the event that a UAV fleet includes multiple types of UAVs configured for different services and/or operations). Additionally or alternatively, each local dispatch system 312 may be configured to track which of its associated UAVs 304 are currently available for deployment and/or are currently in the midst of item transport.

In some cases, when central dispatch system 310 receives a request for UAV-related service (e.g., transport of an item) from access system 302, central dispatch system 310 may select a specific one of UAVs 304 to dispatch. Central dispatch system 310 may accordingly instruct local dispatch system 312 that is associated with the selected UAV to dispatch the selected UAV. Local dispatch system 312 may then operate its associated deployment system 314 to launch the selected UAV. In other cases, central dispatch system 310 may forward a request for a UAV-related service to one of local dispatch systems 312 that is near the location where the support is requested and leave the selection of a particular one of UAVs 304 to local dispatch system 312.

In an example configuration, local dispatch system 312 may be implemented as a computing system at the same location as deployment system(s) 314 that it controls. For example, a particular one of local dispatch system 312 may be implemented by a computing system installed at a building, such as a warehouse, where deployment system(s) 314 and UAV(s) 304 that are associated with the particular one of local dispatch systems 312 are also located. In other embodiments, the particular one of local dispatch systems 312 may be implemented at a location that is remote to its associated deployment system(s) 314 and UAV(s) 304.

Numerous variations on and alternatives to the illustrated configuration of UAV system 300 are possible. For example, in some embodiments, a user of remote device 306 could request delivery of a package directly from central dispatch system 310. To do so, an application may be implemented on remote device 306 that allows the user to provide information regarding a requested delivery, and generate and send a data message to request that UAV system 300 provide the delivery. In such an embodiment, central dispatch system 310 may include automated functionality to handle requests that are generated by such an application, evaluate such requests, and, if appropriate, coordinate with an appropriate local dispatch system 312 to deploy a UAV.

Further, some or all of the functionality that is attributed herein to central dispatch system 310, local dispatch system(s) 312, access system 302, and/or deployment system(s) 314 may be combined in a single system, implemented in a more complex system (e.g., having more layers of control), and/or redistributed among central dispatch system 310, local dispatch system(s) 312, access system 302, and/or deployment system(s) 314 in various ways.

Yet further, while each local dispatch system 312 is shown as having two associated deployment systems 314, a given local dispatch system 312 may alternatively have more or fewer associated deployment systems 314. Similarly, while central dispatch system 310 is shown as being in communication with two local dispatch systems 312, central dispatch system 310 may alternatively be in communication with more or fewer local dispatch systems 312.

In a further aspect, deployment systems 314 may take various forms. In some implementations, some or all of deployment systems 314 may be a structure or system that passively facilitates a UAV taking off from a resting position to begin a flight. For example, some or all of deployment systems 314 may take the form of a landing pad, a hangar, and/or a runway, among other possibilities. As such, a given deployment system 314 may be arranged to facilitate deployment of one UAV 304 at a time, or deployment of multiple UAVs (e.g., a landing pad large enough to be utilized by multiple UAVs concurrently).

Additionally or alternatively, some or all of deployment systems 314 may take the form of or include systems for actively launching one or more of UAVs 304. Such launch systems may include features that provide for an automated UAV launch and/or features that allow for a human-assisted UAV launch. Further, a given deployment system 314 may be configured to launch one particular UAV 304, or to launch multiple UAVs 304.

Note that deployment systems 314 may also be configured to passively facilitate and/or actively assist a UAV when landing. For example, the same landing pad could be used for take-off and landing. Deployment system 314 could also include other structures and/or systems to assist and/or facilitate UAV landing processes.

Deployment systems 314 may further be configured to provide additional functions, including for example, diagnostic-related functions such as verifying system functionality of the UAV, verifying functionality of devices that are housed within a UAV (e.g., a payload delivery apparatus), and/or maintaining devices or other items that are housed in the UAV (e.g., by monitoring a status of a payload such as its temperature, weight, etc.).

In some embodiments, local dispatch systems 312 (along with their respective deployment system(s) 314 may be strategically distributed throughout an area such as a city. For example, local dispatch systems 312 may be strategically distributed such that each local dispatch systems 312 is proximate to one or more payload pickup locations (e.g., near a restaurant, store, or warehouse). However, local dispatch systems 312 may be distributed in other ways, depending upon the particular implementation.

As an additional example, kiosks that allow users to transport packages via UAVs may be installed in various locations. Such kiosks may include UAV launch systems, and may allow a user to provide their package for loading onto a UAV and pay for UAV shipping services, among other possibilities. Other examples are also possible.

In a further aspect, UAV system 300 may include or have access to user-account database 316. User-account database 316 may include data for a number of user accounts, and which are each associated with one or more person. For a given user account, user-account database 316 may include data related to or useful in providing UAV-related services. Typically, the user data associated with each user account is optionally provided by an associated user and/or is collected with the associated user's permission.

Further, in some embodiments, a person may be required to register for a user account with UAV system 300, if they wish to be provided with UAV-related services by UAVs 304 from UAV system 300. As such, user-account database 316 may include authorization information for a given user account (e.g., a user name and password), and/or other information that may be used to authorize access to a user account.

In some embodiments, a person may associate one or more of their devices with their user account, such that they can access the services of UAV system 300. For example, when a person uses an associated mobile phone to, e.g., place a call to an operator of access system 302 or send a message requesting a UAV-related service to a dispatch system, the phone may be identified via a unique device identification number, and the call or message may then be attributed to the associated user account. Other examples are also possible.

V. EXAMPLE BATTERY CAPACITY

Figure 4:
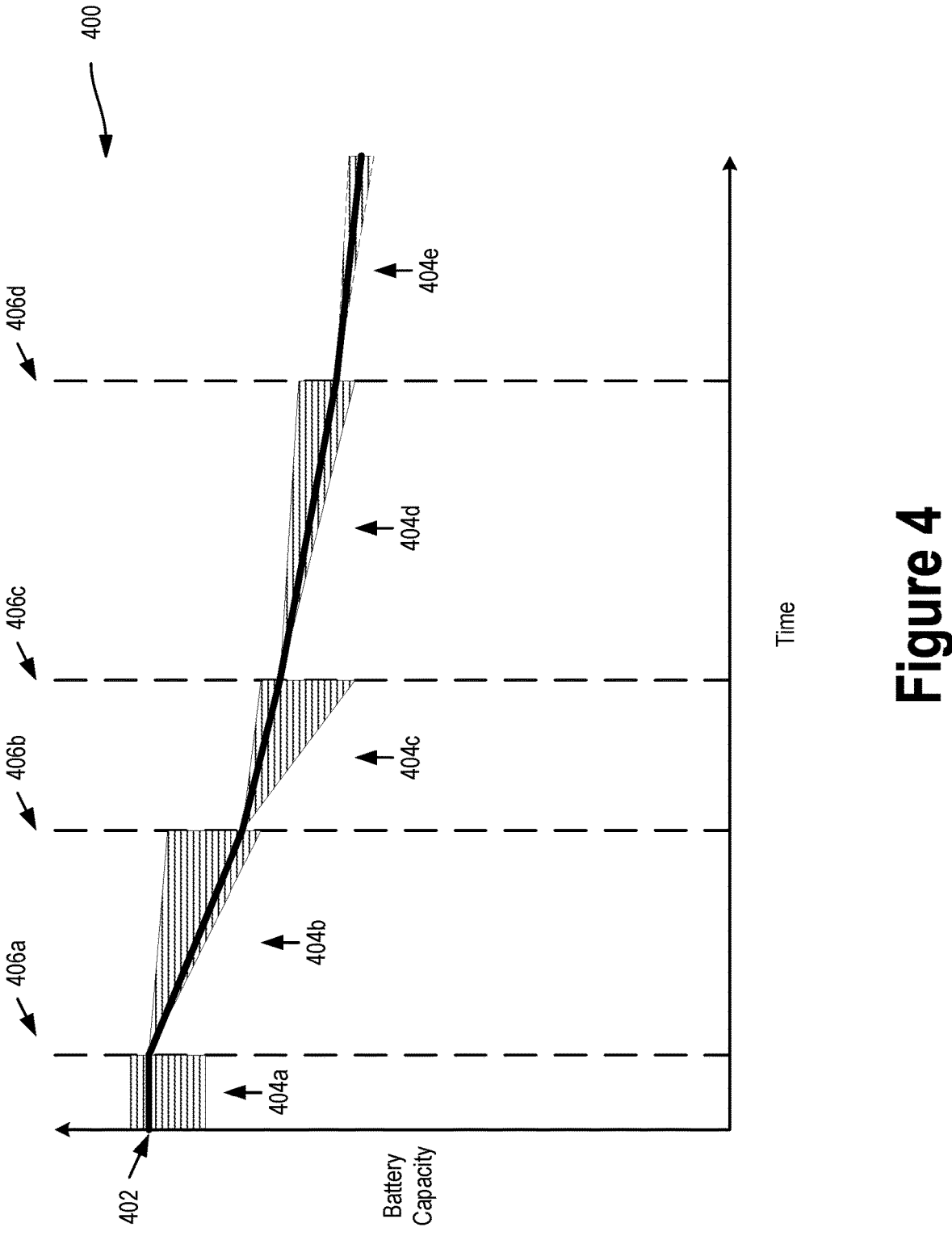
FIG. 4 illustrates a graph of battery capacity over time, in accordance with examples described herein.

Graph 400 shown in FIG. 4 illustrates an example of a deterioration of a capacity of a battery and a variability/uncertainty associated with the capacity of the battery over the battery's lifetime. In this example, the battery has a true capacity 402 (indicated by the dark line in graph 400), which may be expressed in units of Watt-hours (Wh) and/or Ampere-hours (Ah), among other possibilities. The true capacity 402 indicates the actual amount of energy that the battery can store at different points in the battery's lifetime. In practice, the true capacity 402 may be measurable, but it might not be possible, feasible, and/or practical to measure the true capacity 402 at all time points within the battery's lifetime. Thus, the true capacity 402 might be unknown at some time points within the battery's lifetime, but it may be determined that the true capacity 402 of the battery is within a capacity range that represents an estimate and/or approximation of the likely capacity of the battery. The capacity range may account for various causes of degradation in the capacity of the battery.

Graph 400 illustrates various capacity ranges of the battery along different periods in the battery's lifetime, including capacity range 404a, capacity range 404b, capacity range 404c, capacity range 404d, and capacity range 404e. In this example, the curve representing true capacity 402 passes through capacity ranges 404a, 404b, 404c, 404d, and 404e. Time stamp 406a, time stamp 406b, time stamp 406c, and time stamp 406d illustrate points in time at which the battery is calibrated, and thus points along the true capacity 402 are measured. As shown in graph 400, by performing the calibration to measure points along the true capacity 402, the variation/uncertainty in the corresponding capacity range is reduced and/or eliminated (e.g., at least for some time following the calibration). However, following each calibration, the capacity of the battery will again degrade and the actual value thereof will become increasingly less certain over time until a subsequent calibration.

Capacity range 404a illustrates an example wherein at least one factor causing the variation/uncertainty in the capacity range includes the capacity of the battery not having been determined since an installation or reinstallation of the battery into a vehicle. Prior to the battery's installation, the battery's capacity may be represented by, for example, a manufacturer's specification of the battery. However, the true capacity 402 may differ from the manufacturer's specification due to differences/variations in manufacturing processes and/or possible production defects, among other possibilities. In some embodiments, variations/uncertainties associated with capacity range 404a may be caused by the battery having been fixed, maintained, and/or modified between a removal and reinstallation of the battery in one or more vehicles, and/or by differences between a vehicle on which the battery was previously installed and a vehicle on which the battery is being installed.

Capacity range 404b illustrates an example wherein at least one factor causing the variation/uncertainty in the capacity of the battery includes a usage history of the battery. In this example, because a calibration is performed at time stamp 406a, the capacity range 404b converges to the true capacity 402. However, after time stamp 406a, the variation/uncertainty again increases over time due to usage of the battery. Usage may cause degradation of the capacity of the battery, and thus increase the capacity range 404b over time, due to deterioration of chemical components of the battery (e.g., catalyst breakdown), deterioration of electrical components of the battery (e.g., electrical connections of the battery, insulators of the battery), and/or deterioration and/or damage to mechanical components of the battery. The aforementioned examples of how usage may affect the capacity range 404b may be measured through at least one chemical, physical, and/or electrical property of the battery, such as a power output, a fluctuation of power over time, a current output, an internal resistance, a temperature, and/or a change in the physical size of the battery.

Capacity range 404c illustrates an example where the capacity range 404c increased more rapidly than capacity range 404b. As a result, the time between battery calibrations in this case, represented by the relatively shorter distance between time stamp 406b and time stamp 406c, is shorter than the time between time stamp 406a and time stamp 406b. At least one factor causing the more rapid increase in the capacity range 404c may include the battery being used in an environment having an environmental condition that is outside of an environmental condition operating range of the battery and/or the vehicle using the battery, the battery being charged at least once to a voltage above its nominal operating voltage range, and/or the battery being drained to a voltage below its nominal operating voltage range.

The nominal operating voltage range may range from a cutoff voltage of the battery to a maximum charging voltage of the battery. The nominal operating voltage range may include therein a nominal voltage of the battery, which may represent, for example, an average voltage at which the battery is configured to operate. In some examples, the nominal operating voltage, the maximum charging voltage, and/or the cutoff voltage of the battery may be based on specifications and/or recommendations provided by a manufacturer of the battery. In other examples, the nominal operating voltage, the maximum charging voltage, and/or the cutoff voltage of the battery may be experimentally determined by testing the battery and/or another battery of similar size, design, and/or electro-chemical composition.

Capacity range 404d illustrates an example where the variability/uncertainty in the capacity of the battery remained relatively low over a relatively longer time period, but the battery was nevertheless recalibrated due to a battery calibration condition being met at time stamp 406d. For example, the battery calibration condition may have been met because an amount of time between time stamp 406c and 406d exceeded a calibration time threshold. The calibration time threshold may be on the order of minutes, hours, days, weeks, months, and/or years, depending on various attributes of the battery, the vehicle, and/or usage patterns thereof. As another example, the battery calibration condition may have been met because the battery has gone through a number of charges and/or discharges that exceeds a calibration cycle threshold. In some embodiments, the battery calibration condition may be met because the battery has been drained to a point where the battery can be discharged to a discharge threshold voltage in under a discharge time threshold. The discharge time threshold may be on the order of, for example, seconds, minutes, hours, and/or days, depending on various attributes of the battery, the vehicle, and/or usage patterns thereof.

Capacity range 404e illustrates an example of the battery being in continued usage, following a calibration at time stamp 406d, and before any subsequent calibrations.

VI. EXAMPLE BATTERY CALIBRATION SYSTEM

Figure 5:
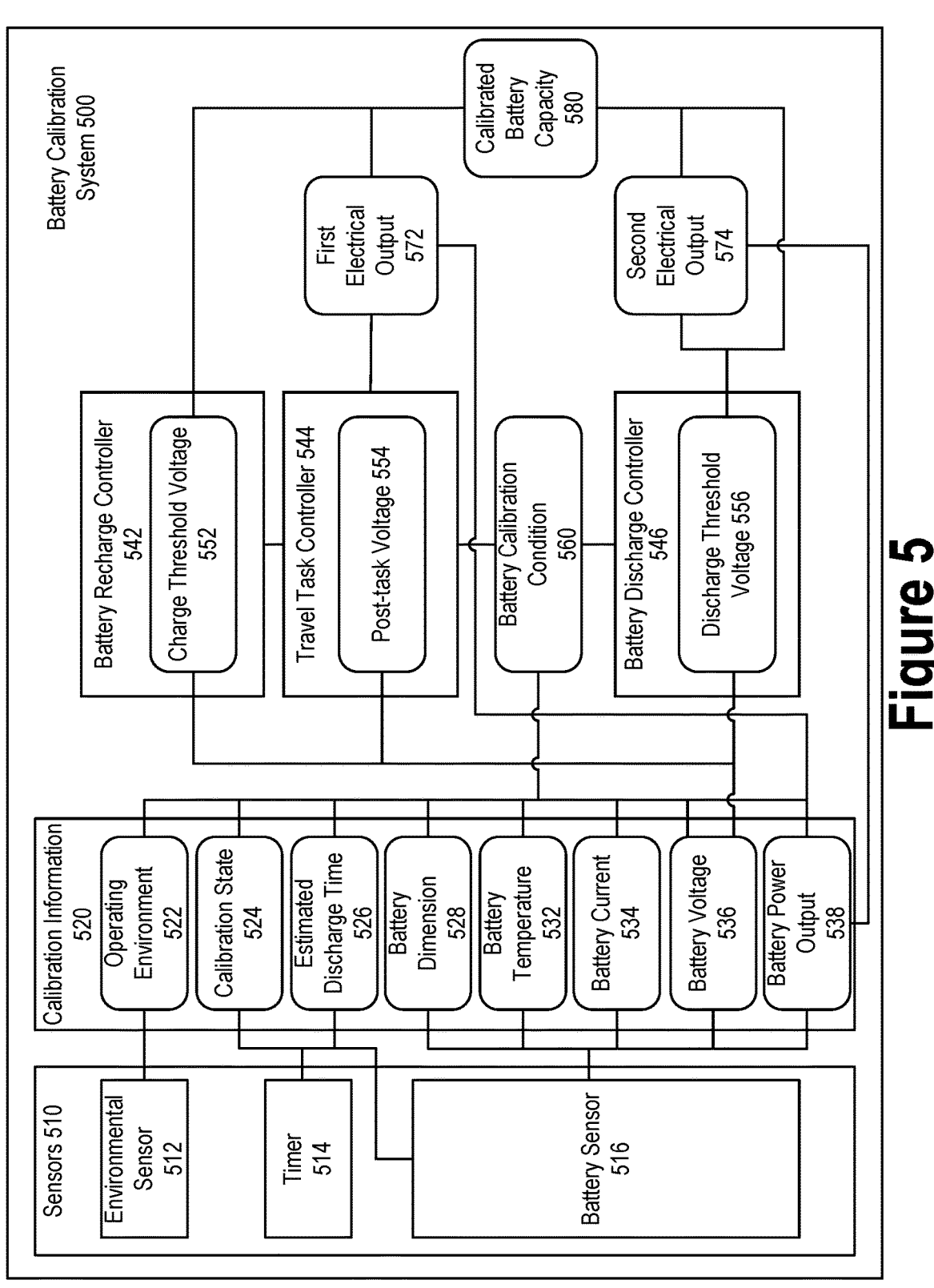
FIG. 5 is a block diagram illustrating a battery calibration system, in accordance with examples described herein.

FIG. 5 illustrates a battery calibration system 500. The battery calibration system 500 may be simplified by the removal of any one or more of the features shown therein. The battery calibration system 500 may be combined with features, aspects, and/or implementations of any of the other figures and/or otherwise described herein. The battery calibration system 500 includes sensors 510, calibration information 520, battery recharge controller 542, travel task controller 544, and battery discharge controller 546.

The sensors 510 may include environmental sensor 512, timer 514, and battery sensor 516. The environmental sensor 512 may include a humidity sensor, a temperature sensor, a pressure sensor, an altitude sensor, a speed sensor, a wind speed sensor, and/or a GPS. The battery sensor 516 may include a battery temperature sensor, a current sensor, a voltage sensor, a power sensor, and/or a pressure sensor. One or more sensors of the sensors 510 may be a part of a battery, a vehicle, and/or an external system that monitors the battery and/or the vehicle. In some embodiments, the sensors may provide their information through the usage of a gauge.

The calibration information 520 may include information regarding operating environment 522, calibration state 524, estimated discharge time 526, battery dimension 528, battery temperature 532, battery current 534, battery voltage 536, and/or battery power output 538. Calibration information 520 may represent and/or be based on sensor data collected from the sensors 510 during one or more time periods when the vehicle was powered by the battery, and may thus provide information about whether the battery is to be calibrated.

The operating environment 522 may include information regarding environment(s) in which the battery and/or vehicle has been operating, and may be based on information recorded by the environmental sensor 512. The operating environment 522 information may include the humidity, temperature, pressure, altitude, speed, wind speed, and/or location of the environment(s) in which the battery or vehicle has been operating.

The calibration state 524 may include information on how long it has been since the battery has last been calibrated, installed in a vehicle, and/or reinstalled in a vehicle. The calibration state 524 may include information on how many charge cycles and/or discharge cycles the battery has performed since the battery has been last calibrated. The calibration state 524 may be based on information recorded by the timer 514 and/or the battery sensor 516.

The estimated discharge time 526 may include information on how long the battery may take to discharge, and may be based on information recorded by the timer 514 and/or the battery sensor 516.

The battery dimension 528 may include information about the size of the battery, and may be based on sensor data generated by the battery sensor 516. For example, a battery dimension may be determined using a pressure sensor of the battery sensor 516 based on pressure sensor data indicating a pressure exerted by the battery on the pressure sensor.

The battery temperature 532 may include information about a temperature of the battery. The temperature of the battery may corresponds to time(s) at which the battery is being utilized, charged, and/or at rest, and may be based on information recorded by the battery sensor 516.

The battery current 534 may include information about the electrical current that is and/or has been output by the battery, and may be based on information recorded by the battery sensor 516. The battery voltage 536 may include information about the voltage that is and/or has been output by the battery, and may be based on information recorded by the battery sensor 516. In some embodiments, if the battery includes a plurality of battery cells, then battery voltage 536 may represent the corresponding voltage of each respective battery cell of the plurality of battery cells, a total voltage of the plurality of battery cells, and/or an average voltage of the plurality of battery cells. The battery power output 538 may include information about the power that is and/or has been output by the battery and/or each of its cells, and may be based on information recorded by the battery sensor 516.

The battery recharge controller 542 may be configured to cause the battery to be charged until the battery voltage 536 reaches a charge threshold voltage 552. Whether the battery has reached the charge threshold voltage 552 may be determined by comparing the charge threshold voltage 552 with the battery voltage 536 gathered by the battery sensor 516. In some embodiments, the charge threshold voltage 552 may depend on the battery's nominal operating voltage range, as discussed above. For example, the charge threshold voltage 552 may be based on the maximum charging voltage of the battery, which forms a top end of the nominal operating voltage range. For example, the charge threshold voltage 552 may be within 15% of the maximum charging voltage of the battery. When the battery is charged to the charge threshold voltage 552, the battery may be considered fully charged at least for a particular battery lifetime.

In some embodiments, determining whether the battery voltage 536 has reached the charge threshold voltage 552 may include determining whether battery current 534 is at or near zero. For example, the battery may be considered fully charged when (i) battery voltage 536 meets or exceeds charge threshold voltage 552 and (ii) battery current 534 drops below a charge threshold current. In some implementations, the determination of whether the battery voltage 536 meets or exceeds the charge threshold voltage 552 may account for the internal resistance of the battery. For example, battery voltage 536 may be based on (i) the terminal voltage measured across the battery and (ii) a product of the internal resistance and battery current 534. Thus, battery voltage 536 and/or the charge threshold voltage 552 may be modified based on battery current 552 and the internal resistance of the battery.

The travel task controller 544 may be configured to control the vehicle (which uses the battery) to perform a travel task. The travel task may include any task that involves the vehicle using the battery to move the vehicle through one or more environments. For example, the travel task may include the vehicle using the battery to move the vehicle from a source location to a destination location, transport at least one object from the source location to the destination location using the vehicle, and/or collect sensor data while the vehicle moves through the one or more environments, among other possibilities. The destination location may have a different longitude, latitude, and/or altitude than the source location.

Using the battery to move the vehicle as part of the travel task may include using the battery to power at least one propulsion unit of the vehicle. The propulsion unit may include a wheel, a propeller, and/or a rotor, among other possibilities. For example, the vehicle may include a UAV as depicted in FIG. 1A, FIG. 1B, FIG. 1C, FIG. 1D, or FIG. 1E, and the propulsion unit may include at least one of horizontal propulsion unit 108, vertical propulsion units 110, propulsion unit 132, propulsion unit 142, propellers 166, or rotors 182. As another example, the vehicle may include a ground vehicle, such as a robotic device or a road-going autonomous vehicle, among other possibilities. As a further example, the vehicle may include a water vehicle and/or an amphibious vehicle, among other possibilities.

As a result of performing the travel task, the battery may be discharged from the charge threshold voltage 552 to a post-task voltage 554. The post-task voltage 554 may be lower than the charge threshold voltage 552 and higher than the discharge threshold voltage 556 specified by the battery discharge controller 546.

The battery calibration system 500 may be configured to determine a first electrical output 572 of the battery during the travel task. For example, the first electrical output of 572 may be determined by travel task controller 544 based on sensor data obtained from battery sensor 516. The first electrical output 572 may represent a current (e.g., measured in Amperes), voltage (e.g., measured in Volts), energy (e.g., measured in Joules), power (e.g., measured in Watts), and/or other electrical property of the battery as measured during the travel task. Thus, the first electrical output 572 may represent and/or be used to determine an amount of energy drawn from the battery in performing the travel task, and thus be at least partly indicative of the capacity of the battery. The first electrical output 572 may be determined continuously over time, and/or may be recorded at discrete time intervals during the travel task.

The battery calibration system 500 may be configured to determine whether a battery calibration condition 560 has been met. For example, the battery calibration system 500 may include a battery calibration controller configured to determine whether one or more of the calibration information 520 meet one or more corresponding conditions. The one or more corresponding conditions may be specified by the battery calibration condition 560.

The battery calibration condition 560 may be met when one or more of the calibration information 520 are determined to be above or below one or more corresponding thresholds. In some cases, the battery calibration condition 560 may be met when the one or more of the calibration information 520 are above or below the one or more corresponding thresholds for at least a predetermined amount of time (e.g., in the time frame since a prior calibration of the battery, and/or since the battery was manufactured).

In some implementations, the battery calibration condition 560 may be based on the operating environment 522, and may be met when the operating environment 522 is above or below a corresponding threshold. For example, the battery calibration condition 560 may be based on at least one of humidity, temperature, pressure, altitude, speed, wind speed, and/or location that the battery or vehicle has been operating in. Examples of how the battery calibration condition 560 may me met include the humidity being above 50% humidity, the temperature being above 40 degrees Celsius, the temperature being below 0 degrees Celsius, the pressure being above 1 Atmospheres, the pressure being below 0.1 Atmospheres, the altitude being 1500 m above sea level, the altitude being below sea level, the speed being above Mach 1, the wind speed being above 60 kilometers per hour, and/or the location containing known hazards. Examples of known hazards that a location may contain include dust, sand, moisture, under water, and/or magnetic flux.

In some implementations, the battery calibration condition 560 may be based on the calibration state 524, and may be met when the calibration state 524 is above or below a corresponding threshold. For example, the calibration state 524 may be based on the amount of time, and/or number of charge-discharge cycles that the battery has been through since the battery was installed or reinstalled on the vehicle, and/or since a prior battery calibration. Examples of how the battery calibration condition 560 may be met include the battery not having gone through a battery calibration since it was installed and/or reinstalled, the amount of time since a prior battery calibration exceeding a threshold amount of time (e.g., 2 days, 10 days, 30 days, etc.), and/or the number of charge-discharge cycles since a prior battery calibration exceeding a threshold number of cycles (e.g., 10, 50, 75, 100, etc.).

In some implementations, the battery calibration condition 560 may be based on estimated discharge time 526, and may be met when estimated discharge time 526 is below a discharge time threshold. For example, the estimated discharge time 526 may be based on an amount of time that the battery, or another battery of similar size and/or electrical-chemical makeup, has taken to discharge in one or more prior discharge cycles.

In some embodiments, whether or not an estimated discharge time 526 is expected to be below a discharge time threshold may depend on whether the post-task voltage 554 is below a partial discharge threshold voltage. In some embodiments, determining whether the estimated discharge time 526 is expected to be below the discharge time threshold may include dividing the battery voltage 536 by a rate that the battery voltage 536 is decreasing, using a discharge curve of the battery to determine estimated discharge time 526, and/or using a predetermined discharge table/mapping for the battery to determine estimated discharge time 526, among other possibilities.

The partial discharge threshold voltage may be a voltage value chosen such that the battery may be able to safely discharge to the discharge threshold voltage 556 in under the discharge time threshold. For example, the partial discharge threshold voltage may be selected to balance considerations of battery utilization and vehicle safety. Specifically, discharging most of the capacity of the battery during the travel task may increase utilization of the battery since, for example, discharging the remaining capacity as part of the battery discharge task may preclude the vehicle from performing other travel tasks while the battery discharge task is executed. However, discharging too much of the capacity of the battery during the travel task may run the risk of the battery running out of energy (e.g., reaching the discharge threshold capacity) before the travel task is completed (e.g., due to the variations and/or errors in estimation of battery capacity). Thus, the partial discharge threshold voltage may be increased to provide increased room for error in battery capacity estimates at the cost of utilization (e.g., resulting in the battery discharge task taking relatively more time), or decreased to favor utilization at the cost of decreased room for error in battery capacity estimates (e.g., resulting in the battery discharge task taking relatively less time).

The partial discharge threshold voltage may be selected further based on an amount of power that can be safely output by the battery during the battery discharge task and/or an amount of power that can be safely used by components of the vehicle without damaging the vehicle and/or surrounding objects in the environment. In some cases, the partial discharge threshold voltage may be determined based on the cost of energy and/or the available amount of energy.

In some embodiments, the travel task controller 544 may create and/or select the travel task prior to the charge battery step. For example, if a travel task is already scheduled for a vehicle powered by the battery, a determination may be made to additionally schedule the battery to undergo a charge battery step in which the battery recharge controller 542 recharges the battery to the charge threshold voltage

552. Additionally or alternatively, it may be possible to delay the initiation of the travel task until the battery is charged to the charge threshold voltage 552 as a result of the charge battery step.

In some cases, a scheduled travel task may be delayed until the battery is charged to the charge threshold voltage 552 if a number of travel tasks assigned to the vehicle and/or a fleet of vehicles is manageable. For example, battery calibration system 500 may have access to a list of travel tasks assigned to be completed by a plurality of vehicles that includes the vehicle powered by the battery. The number of travel tasks may be considered manageable if the number of travel tasks on the list of travel tasks is less than a predetermined number of tasks that the plurality of vehicles can accomplish (e.g., even if the vehicle powered by the battery is temporarily not performing travel tasks). As another example, the total number of travel tasks may be considered manageable if an estimated time needed to accomplish the travel tasks on the list of travel tasks is less than a corresponding threshold time (e.g., such that the travel tasks are expected to be completed before any corresponding deadlines).

In some embodiments, depending on the electro-chemical makeup of the battery (e.g., lithium ion, nickel metal hydride, or nickel cadmium), the battery may be expected not to exhibit a change in size beyond a predetermined battery size threshold during normal operation. Thus, a change in size beyond the predetermined battery size threshold may indicate potential damage to and/or failure of the battery. The battery calibration condition 560 may include the battery dimension 528 being above the predetermined battery size threshold. The battery size threshold may be based on an original size of the battery. For example, the battery size threshold may be equal to the original size, or equal to the original size plus a thermal expansion of the battery expected to occur at battery temperature 532 given the electrical-chemical makeup of the battery. In some cases, a change in size of the battery beyond a maximum battery size may indicate that it may be dangerous for the battery to be discharged, and thus the battery may instead be uninstalled from a vehicle and/or be disposed of.

The battery calibration condition 560 may be based on battery temperature 532, and may be met if the battery temperature 532 is above or below a certain threshold. For example, the capacity of the battery may be expected to degrade quicker and/or with greater variability when the battery is operated at relatively cold and/or relatively hot temperatures that may exceed an operating temperature range associated with the battery.

The battery calibration condition 560 may be based on battery current 534, and may be met if battery current 534 is above or below a certain threshold. For example, the battery current 534 may include the battery's current (e.g., instantaneous, minimum, maximum, average, etc.), a fluctuation of the battery's current over time, and/or an expected current over time. In some embodiments, the battery calibration condition 560 may be met if the battery current 534 is below a charge threshold current, thus indicating that the battery is at or close to full charge.

In some embodiments, the battery calibration condition 560 may depend on an internal resistance of the battery. For example, the internal resistance may be used to modify any measurements related to a voltage of the battery, including battery voltage 536, charge threshold voltage 552, post-task voltage 554, and/or discharge threshold voltage 556. As one example, a battery may have its measured battery voltage 536 (and/or any ranges and measurements that depend on the battery voltage 536) reduced by a product of battery current 534 and the internal resistance. This may be done to more accurately represent the state of charge of the battery, as represented using the measured electrical properties thereof.

The battery discharge controller 546 may cause a battery discharge task to be performed based on and/or in response to the battery calibration condition 560 being met. The battery discharge task may discharge the battery from the post-task voltage 554 to the discharge threshold voltage 556. The discharge threshold voltage 556 may depend on the battery's nominal operating voltage range, as discussed above. For example, the battery's discharge threshold voltage 556 may be based on the cutoff voltage of the battery, which forms a bottom end of the nominal operating voltage range. For example, the discharge threshold voltage 556 may be within 15% of the cutoff voltage of the battery. When the battery is discharged to the discharge threshold voltage 556, the battery may be considered fully discharged (i.e., empty) at least for a particular battery lifetime.

In some embodiments, the battery discharge task may include a single task. In other embodiments, the battery discharge task may include multiple tasks that may be performed one after the other (i.e., serially) or in conjunction with one another (i.e., in parallel). In some embodiments, the battery could be discharged from the charge threshold voltage 552 to the discharge threshold voltage 556 by performing the battery discharge task (i.e., the travel task may be omitted).

An example battery discharge task includes powering at least one propulsion unit and/or actuator of the vehicle using the battery. The propulsion unit may be a wheel, a propeller, a rotor, and/or a robotic arm, among other possibilities. A vehicle that utilizes a propulsion unit configured to move the vehicle through the air may be considered an aerial vehicle.

For example, the propulsion unit may be operated to use up energy stored in the battery without moving the vehicle. When the vehicle is an aerial vehicle, one or more propellers of the aerial vehicle may be operated with a speed and/or power that allows the vehicle to remain stationary. For example, as part of the battery discharge task, the aerial vehicle may be configured to land on a surface in an environment (e.g., a charge pad, a designated landing zone, etc.), and the one or more propellers may be operated to apply a force directed away from the surface. The force may be less than a weight of the aerial vehicle, and may thus be expected to keep the aerial vehicle stationary on the surface. That is, the one or more propellers may be operated in a forward direction of rotation configured to cause the aerial vehicle to hover and/or fly, albeit without enough speed or power to actually overcome the weight of the vehicle.

In another example, the one or more propellers may be operated in a reverse direction, and may thus apply a force directed into the surface. That is, the aerial vehicle may be operated to push itself into the surface. This may allow the aerial vehicle to discharge the battery faster because the one or more propellers may be operated with more power and speed without substantial concern for the aerial vehicle performing an unintended maneuver. Specifically, since the aerial vehicle is being pushed into the surface, the aerial vehicle may be expected to stably remain in a substantially fixed location for the duration of the discharge task.

In further examples, the one or more propellers may be operated to apply to the aerial vehicle a force that is configured to push the aerial vehicle into a surface that is vertical and/or angled relative to the horizontal, among other possibilities. Examples of surfaces against which an aerial vehicle may apply a force include a wall surface, a floor/ground surface, and/or a ceiling surface. The aerial vehicle may land on the surface and/or hoover next to the surface before applying the force against the surface. For example, the aerial vehicle may move into contact with a wall and thereafter increase an amount of force exerted on the wall to increase the rate at which the battery is discharged as part of the battery discharge task.

Thus, in some embodiments, performing the battery discharge task may include constraining the vehicle such that the one or more propulsion units may be operated without moving the vehicle, or at least without moving the vehicle outside of a predetermined operational region reserved for the battery discharge task.

In some embodiments, the vehicle may be constrained using a software-implemented constraint. For example, the battery calibration system 500 may define an operational region in the environment for performing the battery discharge task, and battery discharge controller 546 may be configured to power the one or more propulsion units in a way that does not move the vehicle outside of the operational region. The operational region may be three dimensional.

In other embodiments, the vehicle may be constrained using a physical constraint/restraint. The physical constraint/restraint may include (i) a mass that is placed on the vehicle and that exceeds a maximum transport capacity of the vehicle, (ii) a charging port of a battery charger configured to connect the vehicle to a battery charger (e.g., which may be too heavy for the vehicle to move) configured to charge the battery of the vehicle, and/or (iii) a tether configured to connect the vehicle to a physical feature in an environment, among other possibilities. The vehicle may be physically connected to the constraint/restraint, thereby constraining a motion of the vehicle along one or more degrees of freedom of movements of the vehicle. While the restraint is positioned in physical contact with the vehicle, the propulsion unit may be powered and apply a force along the one or more degrees of freedom without moving the vehicle, or at least without moving the vehicle outside of the operational region.

In some embodiments, if the vehicle moves outside of and/or detaches from the constraint/restraint, the battery discharge task may be paused and the battery may stop powering the propulsion unit. The vehicle may then be moved back into the operational region and/or reconnected to the constraint/restraint. In some cases, prior to moving the vehicle back into the operational region and/or reconnecting it to the constraint/restraint, one or more properties of the battery discharge task (e.g., the power and/or speed with which the propulsion units are driven, and/or a direction of the propulsion units) may be adjusted.

Additionally or alternatively, the battery discharge task may include connecting the battery to an energy storage device (e.g., capacitor, another battery, etc.) configured to store energy discharged from the battery. The battery may be discharged into the energy storage device, thus recycling/conserving at least some of the energy that might otherwise be wasted by the battery discharge task. The battery discharge task may also include powering one or more other components of the vehicle with the battery. The one or more other components may include any components provided on the vehicle, including an electrical heater, an illuminator, and/or a computing hardware (e.g., CPU, GPU, ASIC, etc.). For example, the computing hardware may be powered to perform a computing task on behalf of a third-party and/or a third-party's computing system, thus allowing the vehicle's computational capabilities to be productively utilized as part of the battery discharge task.

In some embodiments, the first electrical output 572 measured during the travel task and the second electrical output 574 measured during the battery discharge task may be used to generate a calibrated battery capacity 580. The first electrical output 572 may be determined by travel task controller 544 as discussed above. The second electrical output 574 may be determined by battery discharge controller 556 based on sensor data obtained from battery sensor 516. The first electrical output 572 may represent a current, voltage, energy, power, and/or other electrical property of the battery as measured during the travel task. Thus, the second electrical output 574 may represent and/or be used to determine an amount of energy drawn from the battery in performing the battery discharge task, and thus be at least partly indicative of the capacity of the battery. The information from either the first electrical output 572 or the second electrical output 574 may be considered, or used to calculate, the state of charge of a battery.

Calibrated battery capacity 580 may be based on a sum of the battery capacity used for the travel task and the battery capacity used for the battery discharge task. Specifically, since the travel task brings the battery from the charge threshold voltage 552 to the post-task voltage 554 and the battery discharge task brings the battery from the post-task voltage 554 to the discharge threshold voltage 556, the calibrated battery capacity 580 reflect the battery's energy output from the charge threshold voltage 552 (e.g., full charge) to the discharge threshold voltage 556 (e.g., empty charge).

In some embodiments, the calibrated battery capacity 580 may be compared to a threshold capacity associated with the battery, the vehicle, and/or a fleet of vehicles. If the calibrated battery capacity 580 is lower than the threshold capacity, the battery may be considered to lack sufficient capacity to operate the vehicle as intended, designed, and/or scheduled. For example, the battery may be considered to be at or near the end of its useful life. Accordingly, an operating voltage range of the battery may be increased to allow the battery to store additional charge, thereby increasing its useable capacity.

The operating voltage range of the battery may be increased by increasing the charge threshold voltage 552, thus allowing the battery to be charged to a higher voltage. Additionally or alternatively, the operating voltage range may be increased by decreasing the discharge threshold voltage 556, thus allowing the battery to be discharged to a lower voltage. When the operating voltage range is increased, the charge threshold voltage 552 as increased and/or the discharge threshold voltage 556 as decreased may be used in subsequent battery calibrations.

While "voltage" has been utilized within the provided examples to represent and/or determine how full a battery is, any usage of voltage shall be understood to more generally include, and thus be replaceable by, a battery state of charge, battery level, and/or a battery condition. For example, charge threshold voltage 552 may represent a charge threshold battery state or level, post-task voltage 554 may represent a post-task battery state or level, and discharge threshold voltage 556 may represent a discharge threshold battery state or level. Thus, the extent to which the battery is charged and/or discharged may be determined, measured, and/or calculated using voltage and/or other electrical and/or physical properties of the battery.

For example, a state of charge of the battery (and/or a rate of change thereof) may be estimated, measured, and/or calculated, and this state of charge may be utilized to determine whether or not an estimated discharge time 526 will be below a discharge time threshold. Additionally, using the state of charge to determine whether or not an estimated discharge time 526 will be below a discharge time threshold may involve a state of charge partial discharge threshold, wherein a battery with a state of charge below the state of charge partial discharge threshold may be expected to discharge within the discharge time threshold.

The battery state of charge, battery level, and/or a battery condition may represent an amount of energy that is contained within the battery. In some embodiments, the battery state of charge may be based on the voltage of the battery, while in other embodiments the state of charge may be determined independently of the voltage. For example, the battery state of charge, battery level, and/or a battery condition may include and/or be based on a current, a pressure, a temperature, dimension(s), a volume, and/or a quantity of fuel cells of the battery, among other possibilities.

VII. EXAMPLE GRAPH

Figure 6:
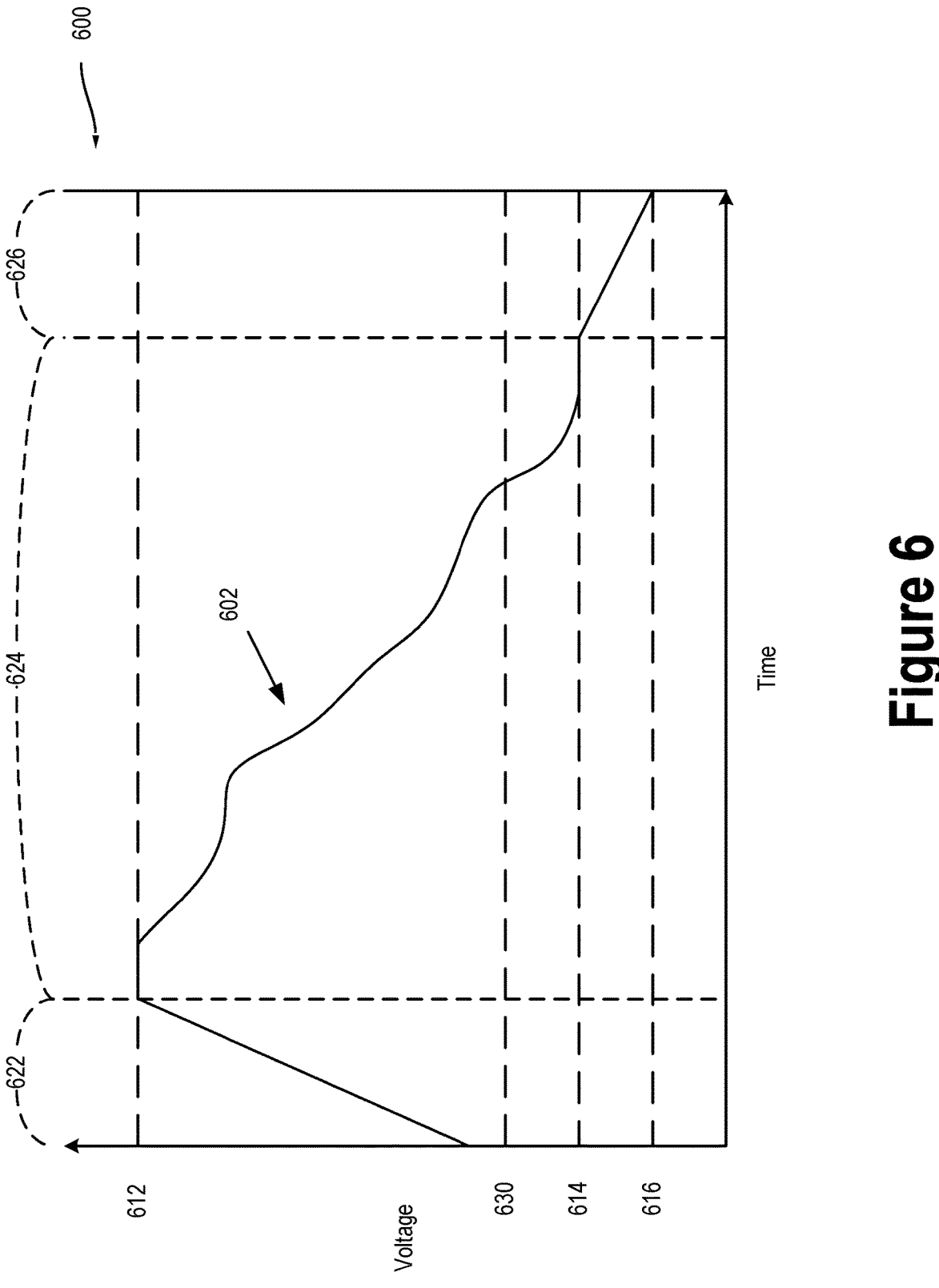
FIG. 6 illustrates a graph of voltage over time, in accordance with examples described herein.

Graph 600 shown in FIG. 6 illustrates an example of a battery undergoing a battery calibration. Curve 602 in the graph 600 shows the battery's voltage over time. Time period 622 shows the battery being charged to a charge threshold voltage 612, which may represent charge threshold voltage 552.

During time period 624, the battery is discharged from the charge threshold voltage 612 to a post-task voltage 614. A first electrical output of the battery may be measured and/or recorded during time period 624. In some embodiments, this discharge from the charge threshold voltage 612 to the post-task voltage 614 may be accomplished while a vehicle connected to the battery performs a travel task.

Following the travel task, a determination may be made as to whether the vehicle meets at least one battery calibration condition. For example, the post-task voltage 614 may be compared with a discharge threshold voltage 630. The battery calibration condition may be met when the post-task voltage 614 is lower than the discharge threshold voltage 630, as shown in graph 600.

Based on and/or in response to the at least one battery calibration condition being met, the battery may be discharged from the post-task voltage 614 to a discharge threshold voltage 616 during time period 626. During time period 626, a second electrical output of the battery may be measured and/or recorded. In some embodiments, this discharge from the post-task voltage 614 to the discharge threshold voltage 616 may be accomplished by performing at least one battery discharge task.

VIII. EXAMPLE BATTERY DISCHARGE TASK

Figure 7:
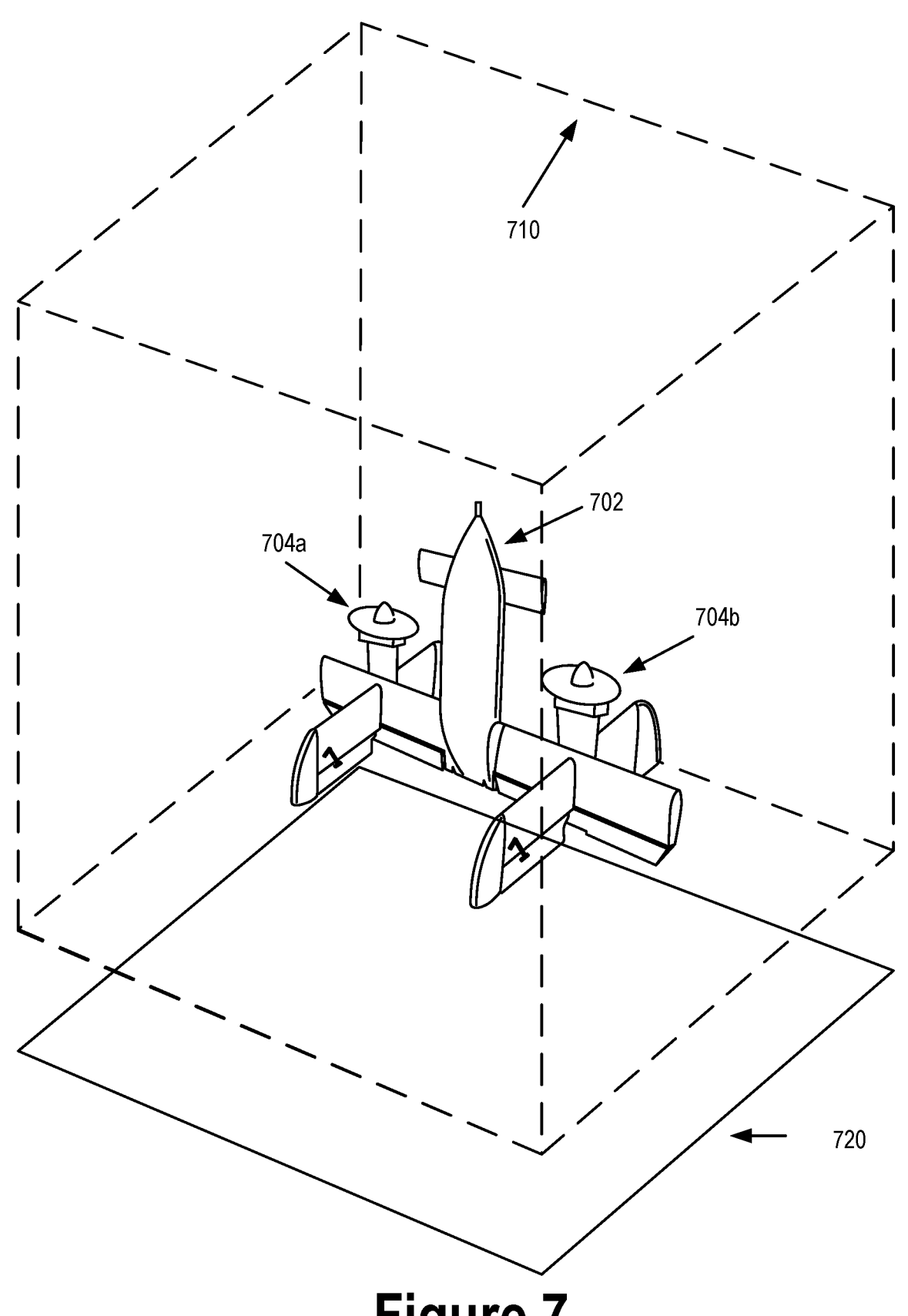
FIG. 7 illustrates an operational region of an aerial vehicle, in accordance with examples described herein.

FIG. 7 shows an example arrangement of a vehicle performing a battery discharge task. Vehicle 702 may be positioned within an operational region 710. The vehicle 702 may be equipped with at least one propulsion unit, such as propeller 704*a* and propeller 704*b*. In some embodiments, the operational region 710 may be above a ground surface 720 (e.g., when the discharge task involves the vehicle 702 hovering), while in another embodiment, the operational region 710 may be in contact with and/or adjacent to the ground surface 720 (e.g., when the discharge task involves the vehicle 702 operating its propulsion units while remaining on ground surface 720).

Operational region 710 may define a volume of space within which it may be considered safe for the vehicle 702 to perform the discharge task. For example, when a plurality of vehicles are located within a relatively small distance of each other (e.g., in a UAV nest/base, landing zone, and/or other shared environment), performing the discharge task within operational region 710 may reduce and/or minimize the likelihood of the vehicle 702 colliding with another vehicle. As another example, performing the discharge task within operational region 710 may reduce and/or minimize the likelihood of the vehicle 702 colliding with static objects in the environment. A size of operational region 710 may be based on a size of vehicle 702, proximity to other vehicles, and/or operations performed by the vehicle 702 as part of the discharge task, among other possibilities.

In some embodiments, by powering the propellers 704*a* and/or 704*b* with a battery of the vehicle 702, the battery may be brought from a post-task voltage to a discharge threshold voltage. A second electrical output of the battery may be measured while propellers 704*a* and/or 704*b* are powered using the battery to quantify a capacity of the battery.

In some embodiments, if the vehicle 702 moves outside of the operational region 710 while performing the battery discharge task, the battery discharge task may be paused (e.g., by cutting off power from the battery to the propellers 704*a* and/or 704*b*.) After the battery discharge is paused, one or more properties of the battery discharge task, such as the power and/or speed with which propellers 704*a* and/or 704*b* are driven, may be adjusted, and the battery discharge task may be resumed once the vehicle 702 returns to the operational region 710.

The vehicle 702 may be considered to be outside of the operational region 710 if any part of the vehicle is outside of the operational region 710, or if the vehicle 702 is wholly outside of the operational region 710. FIG. 7 depicts operational region 710 as an operational region that is cuboid, but other shapes for operational regions, such as spherical, cylindrical, irregular shapes (e.g., a shape that matches the contours of the environment), and/or other shapes are possible and contemplated herein.

In some embodiments, the battery discharge task may be paused based on a detected motion of the vehicle 702. The motion may represent linear and/or angular motion, and may include a displacement, a speed, and/or an acceleration. The motion may be detected through a motion sensing device, such as a motion detector, a gyroscope, an accelerometer, and/or a camera, among other possibilities. In some embodiments, the motion sensing device may be attached to the vehicle 702, while in another embodiment the motion sensing device may be outside of the vehicle 702.

In some embodiments, the battery discharge task may be paused if the detected motion exceeds a predetermined motion threshold. The predetermined motion threshold may be based on an amount of motion that the vehicle is permitted to experience. The amount of motion that the vehicle is permitted to experience may be determined based on the type of battery discharge task, the amount of power and/or energy that is being discharged through the battery discharge task, and/or the physics associated with the battery discharge task, among other possibilities. For example, if propeller 704 (*a*) is used as a part of the battery discharge task, then the predetermined motion threshold may be based on a force expected to be generated by the propeller 704 (*a*) and/or an amount of motion of the vehicle 702 expected to be caused by the force. In some embodiments, the motion threshold may be 0%-50% above or below the expected motion of the vehicle 702.

IX. EXAMPLE METHOD

Figure 8:
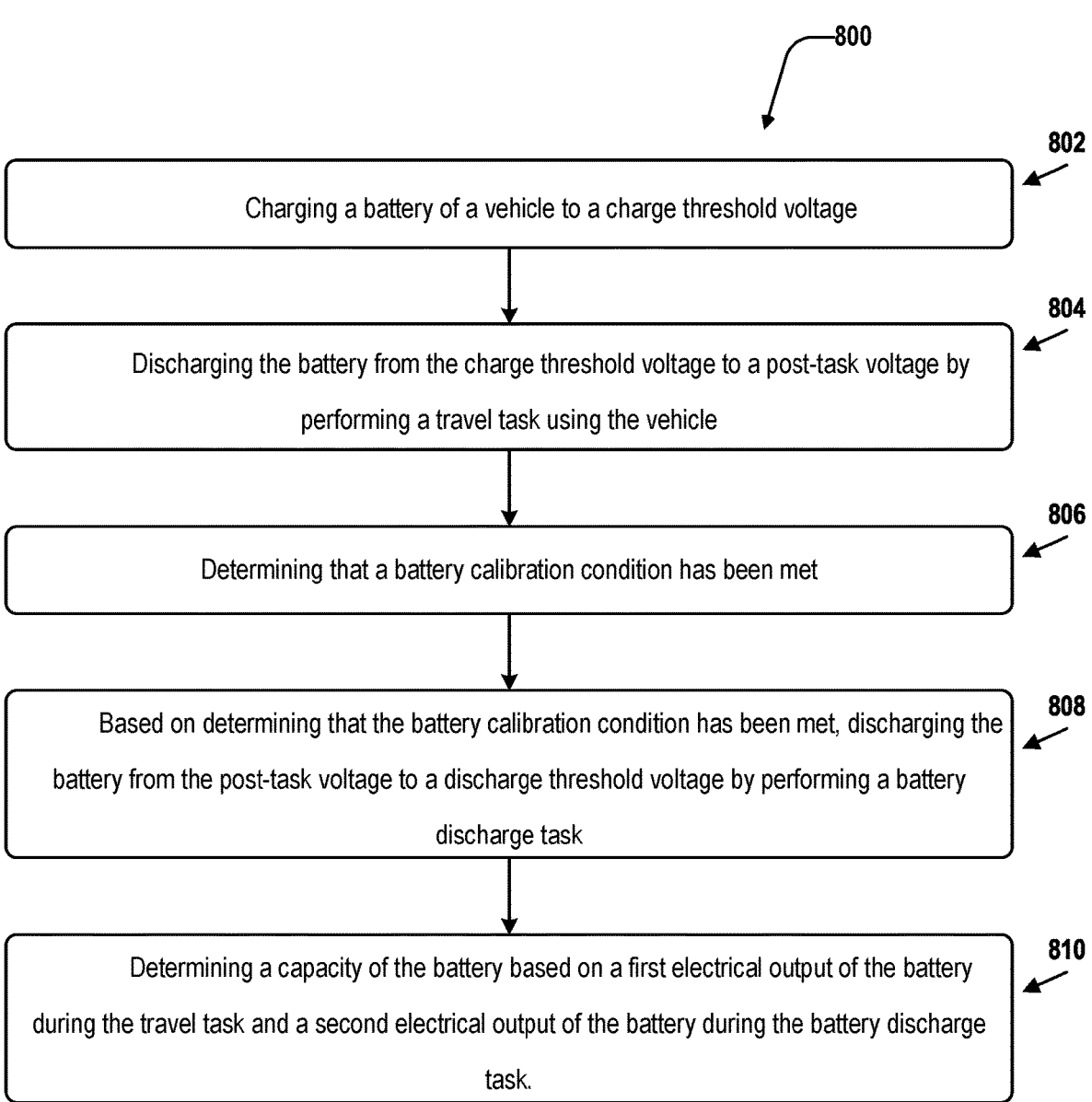
FIG. 8 is a flow chart, in accordance with examples described herein.

FIG. 8 illustrates a flow chart 800 of operations related to calibrating a battery and determining the battery's capacity. The embodiments of FIG. 8 may be simplified by the removal of any one or more of the features shown therein. Further, these embodiments may be combined with features, aspects, and/or implementations of any of the previous figures or otherwise described herein.

Block 802 may involve charging a battery of a vehicle to a charge threshold voltage.

Block 804 may involve discharging the battery from the charge threshold voltage to a post-task voltage by performing a travel task using the vehicle.

Block 806 may involve determining that a battery calibration condition has been met.

Block 808 may involve, based on determining that the battery calibration condition has been met, discharging the battery from the post-task voltage to a discharge threshold voltage by performing a battery discharge task.

Block 810 may involve determining a capacity of the battery based on a first electrical output of the battery during the travel task and a second electrical output of the battery during the battery discharge task.

In some examples, determining that the battery calibration condition has been met may include determining that the post-task voltage is below a partial discharge threshold voltage that allows the battery discharge task to be completed in under a discharge time threshold.

In some examples, determining that the battery calibration condition has been met may include determining that an amount of time elapsed since a prior determination of the capacity of the battery exceeds a calibration time threshold.

In some examples, determining that the battery calibration condition has been met may include determining that a number of discharge cycles of the battery since the prior determination of the capacity of the battery exceeds a calibration cycle threshold.

In some examples, determining that the battery calibration condition has been met may include determining that a value of at least one of a physical property of the battery or an electrical property of the battery is outside of a battery condition operating range.

In some examples, determining that the battery calibration condition has been met may include determining that the battery was used in an environment having an environmental condition that is outside of an environmental condition operating range associated with the vehicle.

In some examples, determining that the battery calibration condition has been met may include determining that the capacity of the battery has not been determined since at least one of installation or reinstallation of the battery in the vehicle.

In some examples, the vehicle may include an aerial vehicle. The battery discharge task may include landing the aerial vehicle on a surface in an environment and operating one or more propellers of the aerial vehicle to apply, to the aerial vehicle, a force directed toward the surface.

In some examples, the vehicle may include an aerial vehicle. The battery discharge task may include landing the aerial vehicle on a surface in an environment and operating one or more propellers of the aerial vehicle to apply, to the aerial vehicle, a force directed away from the surface. The force may be less than a weight of the aerial vehicle.

In some examples, the vehicle may include an aerial vehicle. The battery discharge task may include determining an operational region for the battery discharge task, operating one or more propellers of the aerial vehicle, and determining that, while operating the one or more propellers of the aerial vehicle, the aerial vehicle moved outside of the operational region. Based on determining that the aerial vehicle moved outside of the operational region, the battery discharge task may be paused.

In some examples, the battery discharge task may include operating the aerial vehicle to return to the operational region, adjusting one or more properties of the battery discharge task, and, based on the aerial vehicle returning to the operational region, resuming the battery discharge task according to the adjusted one or more properties.

In some examples, the battery discharge task may include positioning the vehicle to physically contact a restraint configured to constrain a motion of the vehicle along one or more degrees of freedom and, while the vehicle is positioned in physical contact with the restraint, operating a motor of the vehicle to apply a force along the one or more degrees of freedom.

In some examples, the restraint may include (i) a payload having a mass that exceeds a maximum transport capacity of the vehicle, (ii) a charging port of a battery charger configured to charge the battery of the vehicle, and/or (iii) a tether configured to connect the vehicle to a physical feature in an environment.

In some examples, the battery discharge task may include connecting the battery to an energy storage device configured to store energy discharged from the battery and discharging the battery into the energy storage device.

In some examples, the battery discharge task may include operating an electrical heater on the vehicle by powering the electrical heater with the battery.

In some examples, the battery discharge task may include operating an illuminator on the vehicle by powering the illuminator with the battery.

In some examples, the battery discharge task may include performing a computing task using computing hardware of the vehicle on behalf of a third-party computing system.

In some examples, discharging the battery from the charge threshold voltage to the post-task voltage may include, prior to performing the travel task, determining that the travel task is expected to discharge the battery to below a partial discharge threshold voltage. Post-task voltages below the partial discharge threshold voltage may allow the battery discharge task to be completed in under a discharge time threshold. Discharging the battery from the charge threshold voltage to the post-task voltage may also include determining to perform the travel task based on determining that the post-task voltage is expected to discharge the battery to below the partial discharge threshold voltage.

In some examples, charging the battery of the vehicle to the charge threshold voltage may include determining a number of travel tasks scheduled for a fleet of vehicles that comprises the vehicle, determining that the number of travel tasks is lower than a threshold number of travel tasks, and, based on determining that the number of travel tasks is lower than the threshold number of travel tasks, delaying initiation of the travel task until the battery is charged to the charge threshold voltage.

In some examples, it may be determined that the capacity of the battery is below a threshold capacity. The capacity may correspond to an operating voltage range from the discharge threshold voltage to the charge threshold voltage. Based on determining that the capacity of the battery is below the threshold capacity, the operating voltage range may be increased by at least one of (i) increasing the charge threshold voltage or (ii) decreasing the discharge threshold voltage.

In some examples, the travel task may include transporting a payload from a source location to a destination location.

X. CONCLUSION

The present disclosure is not to be limited in terms of the particular embodiments described in this application, which are intended as illustrations of various aspects. Many modifications and variations can be made without departing from its scope, as will be apparent to those skilled in the art. Functionally equivalent methods and apparatuses within the scope of the disclosure, in addition to those described herein, will be apparent to those skilled in the art from the foregoing descriptions. Such modifications and variations are intended to fall within the scope of the appended claims.

The above detailed description describes various features and operations of the disclosed systems, devices, and methods with reference to the accompanying figures. In the figures, similar symbols typically identify similar components, unless context dictates otherwise. The example embodiments described herein and in the figures are not meant to be limiting. Other embodiments can be utilized, and other changes can be made, without departing from the scope of the subject matter presented herein. It will be readily understood that the aspects of the present disclosure, as generally described herein, and illustrated in the figures, can be arranged, substituted, combined, separated, and designed in a wide variety of different configurations.

With respect to any or all of the message flow diagrams, scenarios, and flow charts in the figures and as discussed herein, each step, block, and/or communication can represent a processing of information and/or a transmission of information in accordance with example embodiments. Alternative embodiments are included within the scope of these example embodiments. In these alternative embodiments, for example, operations described as steps, blocks, transmissions, communications, requests, responses, and/or messages can be executed out of order from that shown or discussed, including substantially concurrently or in reverse order, depending on the functionality involved. Further, more or fewer blocks and/or operations can be used with any of the message flow diagrams, scenarios, and flow charts discussed herein, and these message flow diagrams, scenarios, and flow charts can be combined with one another, in part or in whole.

A step or block that represents a processing of information may correspond to circuitry that can be configured to perform the specific logical functions of a herein-described method or technique. Alternatively or additionally, a block that represents a processing of information may correspond to a module, a segment, or a portion of program code (including related data). The program code may include one or more instructions executable by a processor for implementing specific logical operations or actions in the method or technique. The program code and/or related data may be stored on any type of computer readable medium such as a storage device including random access memory (RAM), a disk drive, a solid state drive, or another storage medium.

The computer readable medium may also include non-transitory computer readable media such as computer readable media that store data for short periods of time like register memory, processor cache, and RAM. The computer readable media may also include non-transitory computer readable media that store program code and/or data for longer periods of time. Thus, the computer readable media may include secondary or persistent long term storage, like read only memory (ROM), optical or magnetic disks, solid state drives, compact-disc read only memory (CD-ROM), for example. The computer readable media may also be any other volatile or non-volatile storage systems. A computer readable medium may be considered a computer readable storage medium, for example, or a tangible storage device.

Moreover, a step or block that represents one or more information transmissions may correspond to information transmissions between software and/or hardware modules in the same physical device. However, other information transmissions may be between software modules and/or hardware modules in different physical devices.

The particular arrangements shown in the figures should not be viewed as limiting. It should be understood that other embodiments can include more or less of each element shown in a given figure. Further, some of the illustrated elements can be combined or omitted. Yet further, an example embodiment can include elements that are not illustrated in the figures.

While various aspects and embodiments have been disclosed herein, other aspects and embodiments will be apparent to those skilled in the art. The various aspects and embodiments disclosed herein are for purpose of illustration and are not intended to be limiting, with the true scope being indicated by the following claims.

What is claimed is:

1. A method comprising:
charging a battery of a vehicle to a charge threshold voltage;
performing a travel task using the vehicle to discharge the battery from the charge threshold voltage to a post-task voltage;
determining that a battery calibration condition has been met;
based on determining that the battery calibration condition has been met, discharging the battery from the post-task voltage to a discharge threshold voltage by performing a battery discharge task; and
determining a capacity of the battery based on a first electrical output of the battery during the travel task and a second electrical output of the battery during the battery discharge task.

2. The method of claim 1, wherein determining that the battery calibration condition has been met comprises:
determining that the post-task voltage is below a partial discharge threshold voltage that allows the battery discharge task to be completed in under a discharge time threshold.

3. The method of claim 1, wherein determining that the battery calibration condition has been met comprises one or more of:
determining that an amount of time elapsed since a prior determination of the capacity of the battery exceeds a calibration time threshold; or
determining that a number of discharge cycles of the battery since the prior determination of the capacity of the battery exceeds a calibration cycle threshold.

4. The method of claim 1, wherein determining that the battery calibration condition has been met comprises:

determining that a value of at least one of a physical property of the battery or an electrical property of the battery is outside of a battery condition operating range.

5. The method of claim 1, wherein determining that the battery calibration condition has been met comprises:
determining that the battery was used in an environment having an environmental condition that is outside of an environmental condition operating range associated with the vehicle.

6. The method of claim 1, wherein determining that the battery calibration condition has been met comprises:
determining that the capacity of the battery has not been determined since at least one of installation or reinstallation of the battery in the vehicle.

7. The method of claim 1, wherein the vehicle comprises an aerial vehicle, and wherein the battery discharge task comprises:
landing the aerial vehicle on a surface in an environment; and
operating one or more propellers of the aerial vehicle to apply, to the aerial vehicle, a force directed toward the surface.

8. The method of claim 1, wherein the vehicle comprises an aerial vehicle, and wherein the battery discharge task comprises:
landing the aerial vehicle on a surface in an environment; and
operating one or more propellers of the aerial vehicle to apply, to the aerial vehicle, a force directed away from the surface, wherein the force is less than a weight of the aerial vehicle.

9. The method of claim 1, wherein the vehicle comprises an aerial vehicle, and wherein the battery discharge task comprises:
determining an operational region for the battery discharge task;
operating one or more propellers of the aerial vehicle;
determining that, while operating the one or more propellers of the aerial vehicle, the aerial vehicle moved outside of the operational region; and
based on determining that the aerial vehicle moved outside of the operational region, pausing the battery discharge task.

10. The method of claim 9, wherein the battery discharge task comprises:
operating the aerial vehicle to return to the operational region;
adjusting one or more properties of the battery discharge task; and
based on the aerial vehicle returning to the operational region, resuming the battery discharge task according to the adjusted one or more properties.

11. The method of claim 1, wherein the battery discharge task comprises:
positioning the vehicle to physically contact a restraint configured to constrain a motion of the vehicle along one or more degrees of freedom; and
while the vehicle is positioned in physical contact with the restraint, operating a motor of the vehicle to apply a force along the one or more degrees of freedom.

12. The method of claim 11, wherein the restraint comprises at least one of:
a payload having a mass that exceeds a maximum transport capacity of the vehicle;
a charging port of a battery charger configured to charge the battery of the vehicle; or a tether configured to connect the vehicle to a physical feature in an environment.

13. The method of claim 1, wherein the battery discharge task comprises:

connecting the battery to an energy storage device configured to store energy discharged from the battery; and discharging the battery into the energy storage device.

14. The method of claim 1, wherein the battery discharge task comprises at least one of:

operating an electrical heater on the vehicle by powering the electrical heater with the battery;

operating an illuminator on the vehicle by powering the illuminator with the battery; or performing a computing task using computing hardware of the vehicle on behalf of a third-party computing system.

15. The method of claim 1, wherein discharging the battery from the charge threshold voltage to the post-task voltage comprises:

prior to performing the travel task, determining that the travel task is expected to discharge the battery to below a partial discharge threshold voltage, wherein post-task voltages below the partial discharge threshold voltage allow the battery discharge task to be completed in under a discharge time threshold; and determining to perform the travel task based on determining that the post-task voltage is expected to discharge the battery to below the partial discharge threshold voltage.

16. The method of claim 1, wherein charging the battery of the vehicle to the charge threshold voltage comprises:

determining a number of travel tasks scheduled for a fleet of vehicles that comprises the vehicle;

determining that the number of travel tasks is lower than a threshold number of travel tasks; and based on determining that the number of travel tasks is lower than the threshold number of travel tasks, delaying initiation of the travel task until the battery is charged to the charge threshold voltage.

17. The method of claim 1, further comprising:

determining that the capacity of the battery is below a threshold capacity, wherein the capacity corresponds to an operating voltage range from the discharge threshold voltage to the charge threshold voltage; and based on determining that the capacity of the battery is below the threshold capacity, increasing the operating voltage range by at least one of (i) increasing the charge threshold voltage or (ii) decreasing the discharge threshold voltage.

18. The method of claim 1, wherein the travel task comprises transporting a payload from a source location to a destination location.

19. A system comprising:

a processor; and a non-transitory computer-readable storage medium having stored thereon instructions that, when executed by the processor, cause the processor to perform operations comprising:

causing charging of a battery of a vehicle to a charge threshold voltage;

causing the vehicle to perform a travel task to discharge the battery from the charge threshold voltage to a post-task voltage;

determining that a battery calibration condition has been met;

causing discharging of the battery from the post-task voltage to a discharge threshold voltage by causing performance of a battery discharge task; and determining a capacity of the battery based on a first electrical output of the battery during the travel task and a second electrical output of the battery during the battery discharge task.

20. A non-transitory computer-readable storage medium having stored thereon instructions that, when executed by a computing system, cause the computing system to perform operations comprising:

causing charging of a battery of a vehicle to a charge threshold voltage;

causing the vehicle to perform a travel task to discharge the battery from the charge threshold voltage to a post-task voltage;

determining that a battery calibration condition has been met;

causing discharging of the battery from the post-task voltage to a discharge threshold voltage by causing performance of a battery discharge task; and determining a capacity of the battery based on a first electrical output of the battery during the travel task and a second electrical output of the battery during the battery discharge task.

* * * * *